United States Patent
Ware

(10) Patent No.: US 9,208,836 B1
(45) Date of Patent: Dec. 8, 2015

(54) CHIP-TO-CHIP SIGNALING WITH IMPROVED BANDWIDTH UTILIZATION

(75) Inventor: Frederick A. Ware, Los Altos Hills, CA (US)

(73) Assignee: Rambus Inc., Sunnyvale, CA (US)

( * ) Notice: Subject to any disclaimer, the term of this patent is extended or adjusted under 35 U.S.C. 154(b) by 716 days.

(21) Appl. No.: 13/345,987

(22) Filed: Jan. 9, 2012

Related U.S. Application Data

(60) Provisional application No. 61/431,657, filed on Jan. 11, 2011.

(51) Int. Cl.
*G11C 7/10* (2006.01)

(52) U.S. Cl.
CPC ............ *G11C 7/1051* (2013.01); *G11C 7/1006* (2013.01)

(58) Field of Classification Search
CPC ... G11C 7/1051; G11C 7/1006; G11C 7/1078
USPC ............ 365/189.17, 191, 198; 711/167, 711/E12.002
See application file for complete search history.

(56) References Cited

U.S. PATENT DOCUMENTS

| | | | | |
|---|---|---|---|---|
| 5,410,670 | A * | 4/1995 | Hansen et al. | 711/169 |
| 7,340,558 | B2 * | 3/2008 | Lee et al. | 711/5 |
| 2007/0220378 | A1 * | 9/2007 | Mamileti et al. | 714/718 |
| 2008/0175071 | A1 | 7/2008 | Lee et al. | 365/189.04 |
| 2010/0020583 | A1 | 1/2010 | Kang et al. | 365/51 |

* cited by examiner

*Primary Examiner* — Tha-O H Bui
(74) *Attorney, Agent, or Firm* — Charles Shemwell

(57) ABSTRACT

Integrated circuit devices transmit data via a shared signaling link in back to back burst intervals without contention and without insertion of performance-degrading bubbles by disabling output drivers during an interval that occurs at an edge or "margin" of a given burst interval and thus at a timing boundary between the back to back burst intervals. In "bit-level margining" embodiments, the driver-disabling operation or "margining" is performed during a portion of each bit interval (i.e., a unit of time allocated to transmission of a bit or other symbol. In "burst-level margining" embodiments, output drivers are disabled over an entire bit interval that occurs at the margin of a given burst interval.

28 Claims, 12 Drawing Sheets

Burst-Level Margin Logic applies either the abbreviated-burst or standard-burst transmission format for each memory read transaction FIG. 2 Bit-level Margin Control

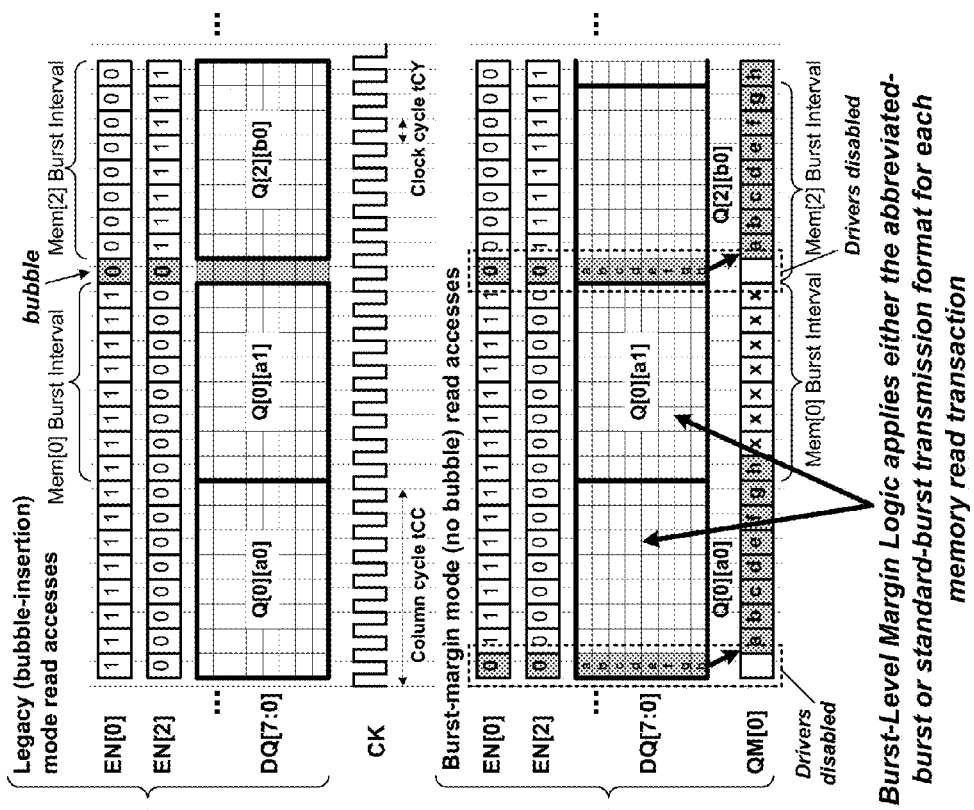
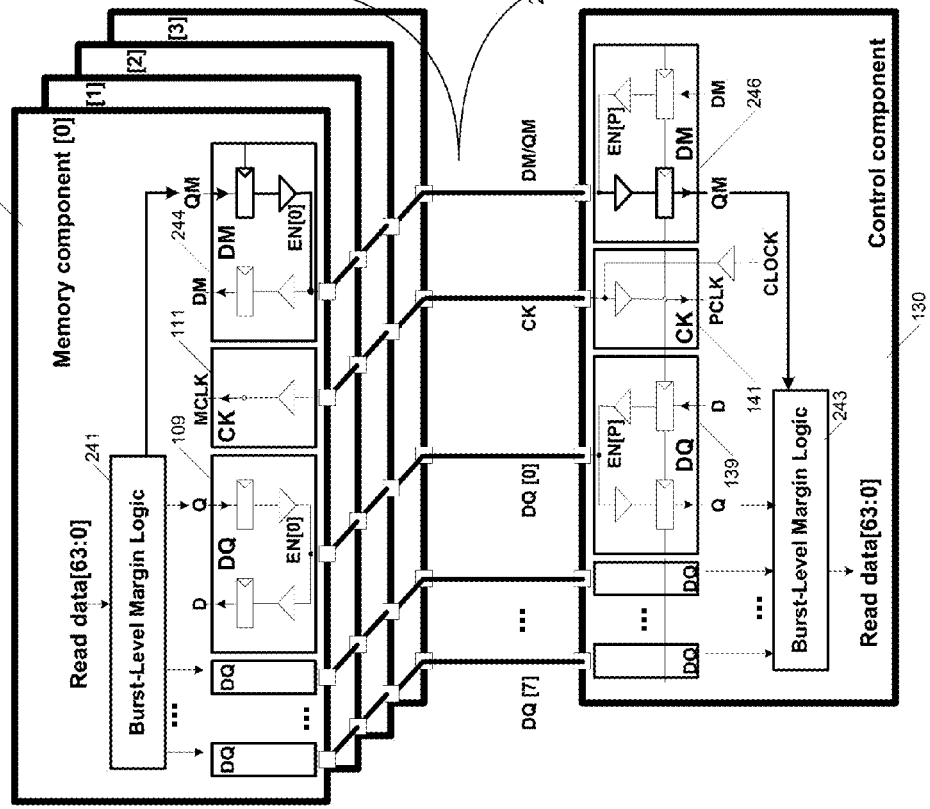
FIG. 3

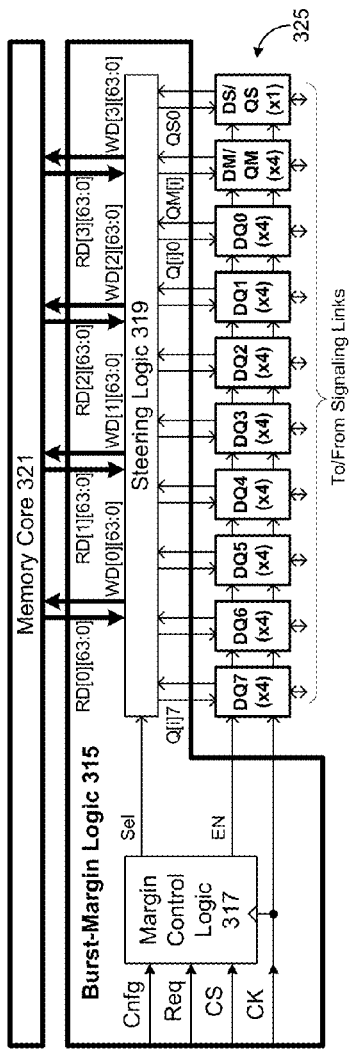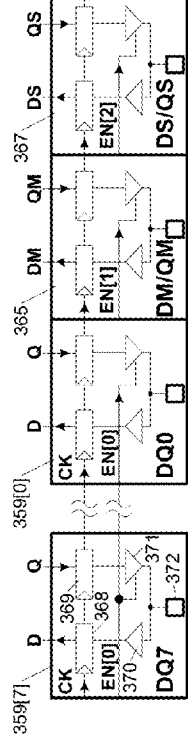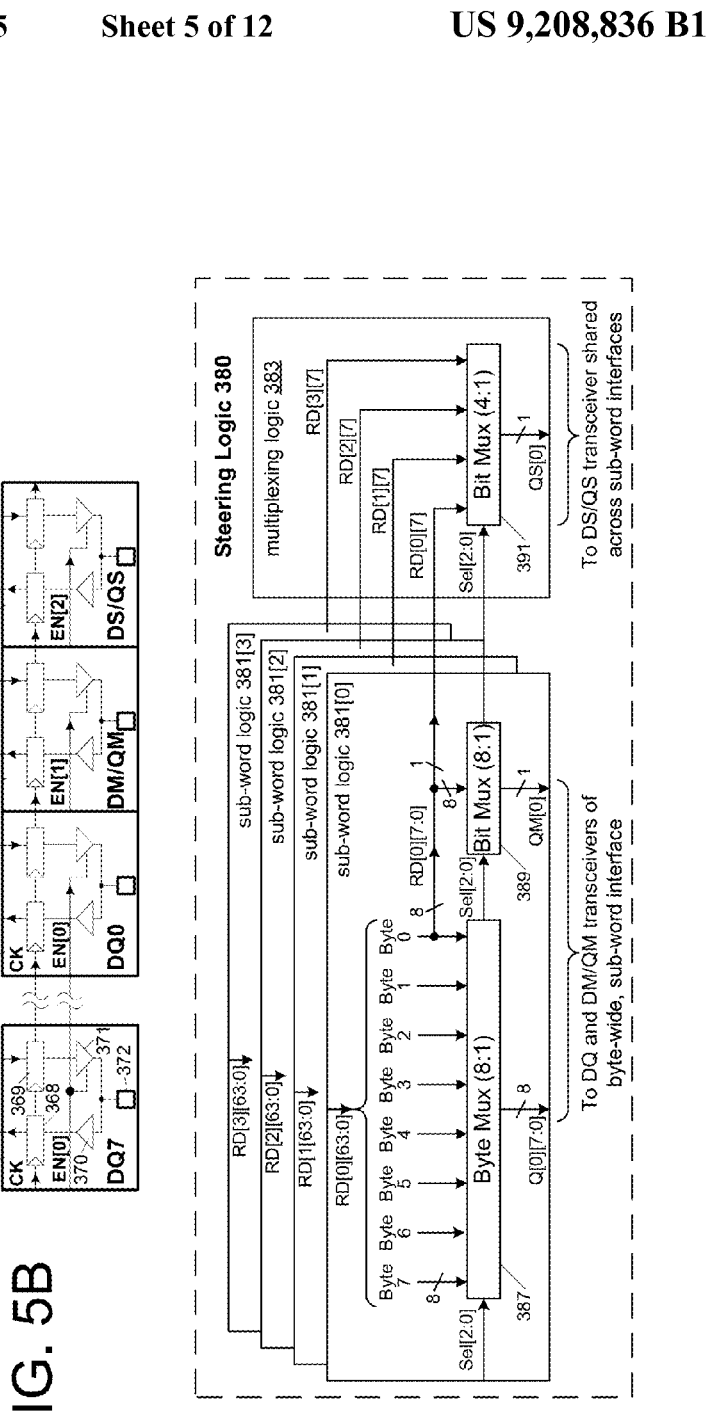
FIG. 5A
FIG. 5B
FIG. 5C

FIG. 7A
Burst Margin Enabled,
BL=16
FIG. 7B
Burst Margin Enabled,
BL=8, QMx1
FIG. 7C
Burst Margin Enabled,
BL=8, QMx2
FIG. 7D
Burst Margin Enabled,
BL=4, QMx1
FIG. 7E
Burst Margin Enabled,
BL=4, QMx2

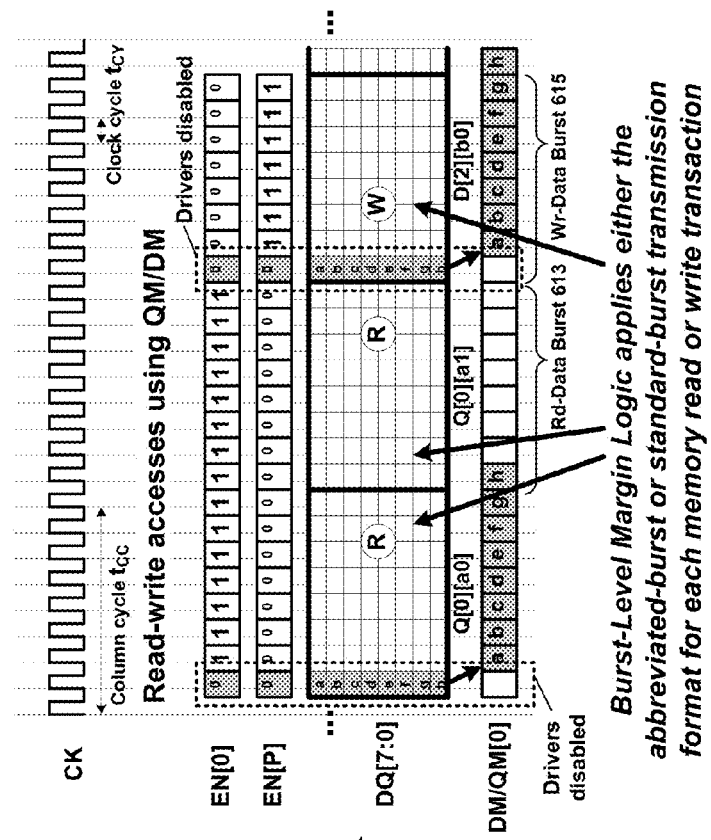
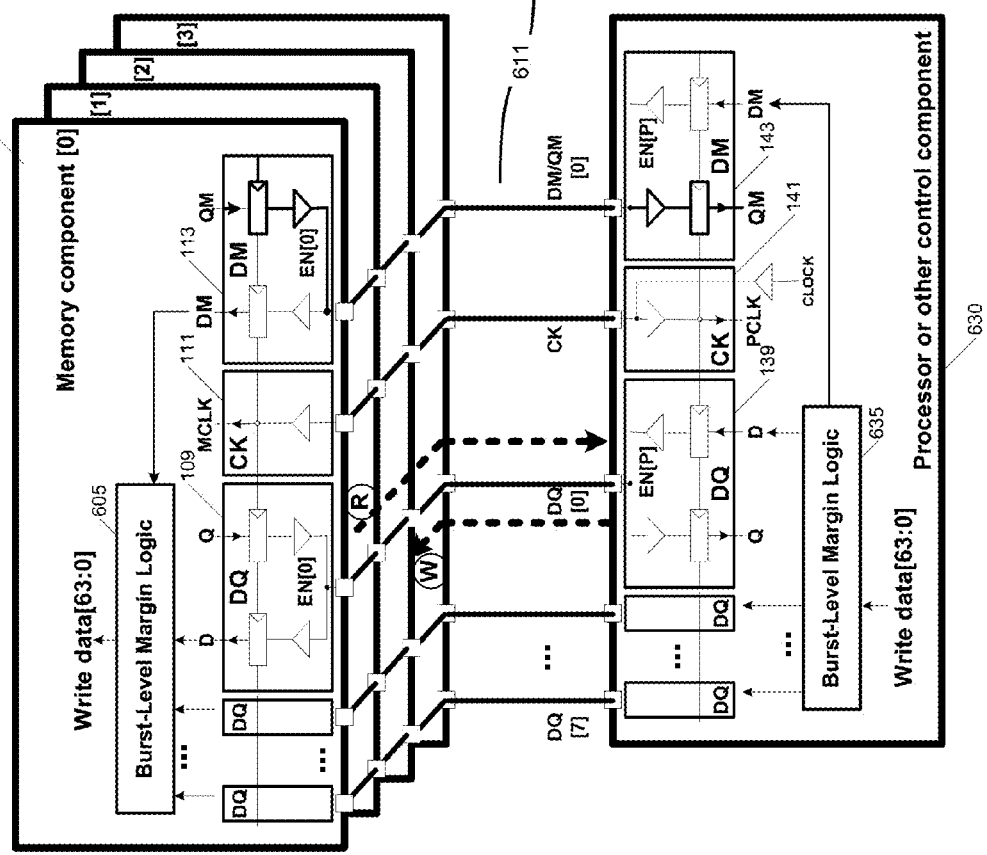
FIG. 12A

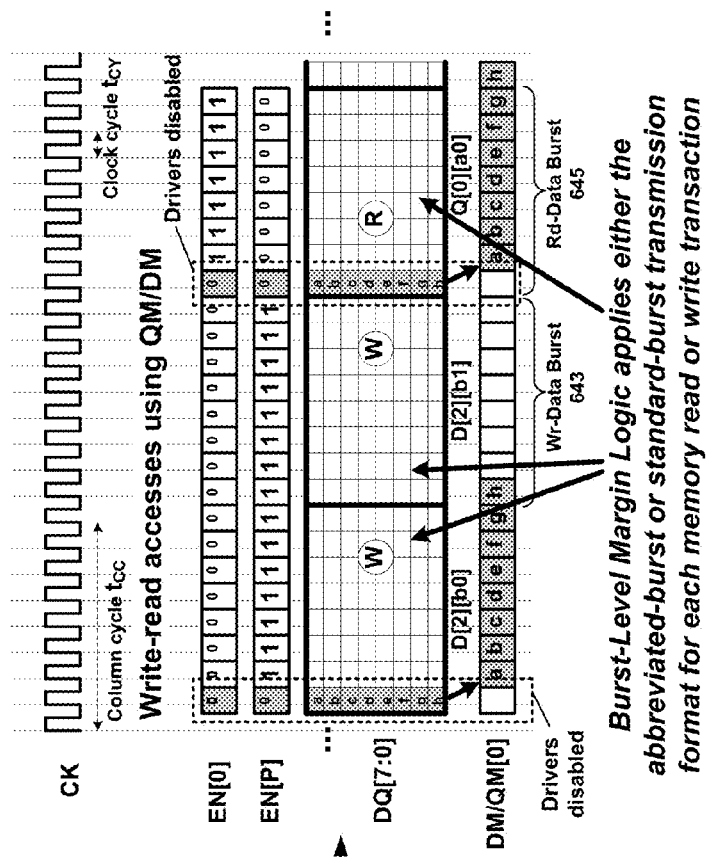
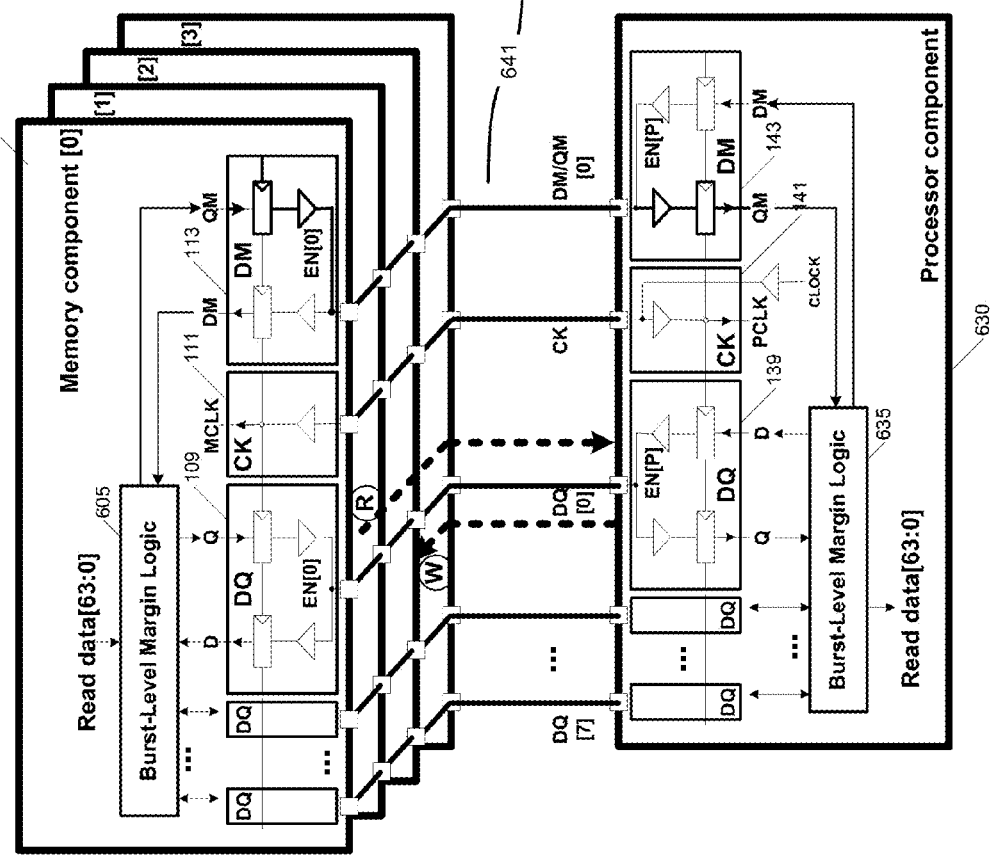
FIG. 12B

CHIP-TO-CHIP SIGNALING WITH IMPROVED BANDWIDTH UTILIZATION

CROSS-REFERENCE TO RELATED APPLICATIONS

This application hereby claims priority to and incorporates by reference U.S. Provisional Application No. 61/431,657, filed Jan. 11, 2011 and entitled "CHIP-TO-CHIP SIGNALING WITH IMPROVED BANDWIDTH UTILIZATION."

TECHNICAL FIELD

The present invention relates generally to the field of electronic communications and more particularly to signaling between integrated circuit devices.

BACKGROUND

In an ideal memory system, memory components commanded to transmit data one after another on a shared signaling link will output data in respective burst intervals seamlessly and without contention, the output driver in one component being disabled just as the output driver in the other is enabled. In practice, however, various sources of timing skew may result in brief overlap between driver-enable intervals within the two memory components and thus a transitory interval of simultaneous transmission on the shared signaling link referred to herein as "link contention." Such link contention is particularly problematic when push-pull output drivers are simultaneously enabled to drive the signaling link to opposite states, as high and low voltage nodes of the signaling power supply are briefly shorted to one another, consuming power and injecting noise.

Although delays or "bubbles" may be inserted between burst intervals to avoid link contention, such delays increase overall memory latency and reduce the effective bandwidth of the signaling link, a performance penalty multiplied by the number of signaling links. Also, the relatively coarse timing granularity of the delay control source (e.g., the core domain of a memory controller) may impose a delay interval many times longer than needed to avoid signaling contention, thus magnifying the performance penalty.

BRIEF DESCRIPTION OF THE DRAWINGS

The present invention is illustrated by way of example, and not by way of limitation, in the figures of the accompanying drawings and in which like reference numerals refer to similar elements and in which:

FIG. 3 illustrates an exemplary operation of burst-level margin logic implemented within memory and control components of a memory system to avoid signaling contention on shared data links;

FIG. 5A illustrates an embodiment of a burst-margin logic circuit that may be used to implement the burst-level margin logic within the memory components of FIG. 3;

FIG. 5B illustrates an exemplary set of transceivers that may be used to implement the byte-wide physical signaling interface (PHY) described in reference to FIG. 5A;

FIG. 5C illustrates an embodiment of a steering logic circuit that may be used to implement steering logic shown in FIG. 5A;

FIGS. 7A-7E illustrate the select and enable signal outputs from the margin control logic of FIG. 5A (or 5C) for different burst-length selections and margin-streaming modes when burst-level margin control is enabled;

FIGS. 12A and 12B illustrate burst-margin logic circuits that may be provided within control and memory components to enable burst-margined write-data signaling in addition to burst-margined read-data signaling.

DETAILED DESCRIPTION

In various embodiments disclosed herein, integrated circuit devices transmit data via a shared signaling link in back to back burst intervals without contention and without insertion of performance-degrading bubbles by disabling output drivers during an interval that occurs at an edge or "margin" of a given burst interval and thus at a timing boundary between the back to back burst intervals. In a number of embodiments, referred to herein as "bit-level margining" embodiments, the driver-disabling operation or "margining" is performed during a portion of each bit interval (i.e., a unit of time allocated to transmission of a bit or other symbol. In other embodiments, referred to herein as "burst-level margining" or "burst-margining" embodiments, output drivers are disabled over an entire bit interval that occurs at the margin of a given burst interval. In all such embodiments, link contention may be avoided without insertion of performance degrading bubbles.

Figure 1:
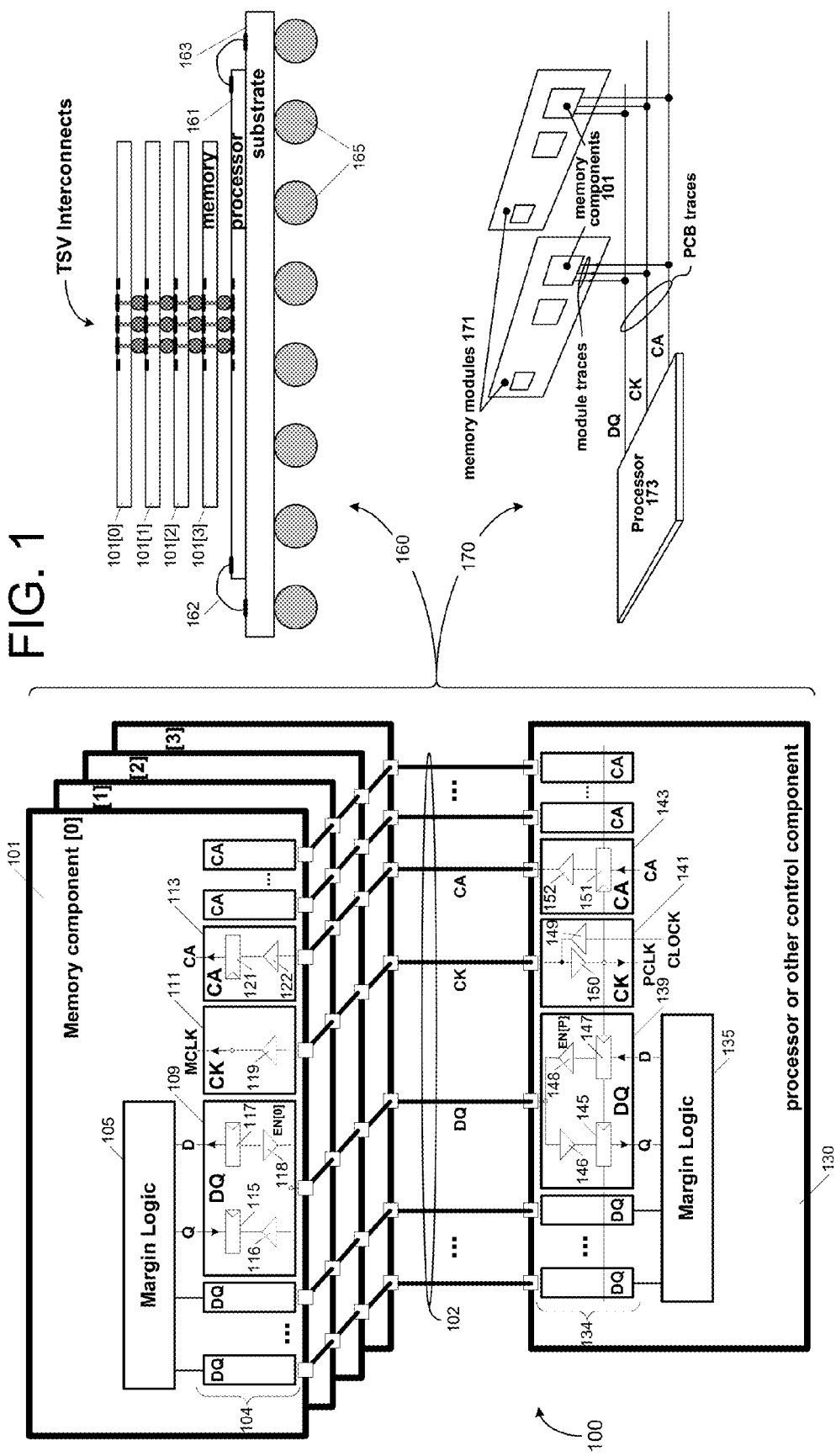
FIG. 1 illustrates an embodiment of a margining memory system having a control component coupled to multiple memory components via a set of shared signaling links.

FIG. 1 illustrates an embodiment of a "margining" memory system 100 having a control component 130 coupled to multiple memory components 101 via a set of shared signaling links 102. As shown, each of the memory components and the control component includes a signaling interface 104, 134 to enable command/address (CA) and data transfer, as well as margin logic 105, 135 to effect bit-level margining or burst-level margining with respect to transmitted data. In the particular embodiment shown, an input/output (I/O) clock signal, ("clock") is forwarded from the control component 130 to the memory components via a clock signaling link ("CK") and distributed within both the controller-side and memory-side signaling interfaces to enable synchronous signaling. That is, within control-side signaling interface 134, the I/O clock is routed from clock driver 149 and buffer element 150 (i.e., within clock transmitter 141) to registers 151 within command/address (CA) transmitters 143 and registers 145, 147 within data transceivers 139. The I/O clock is also supplied from buffer 150 to controller core logic (not shown in FIG. 1) to enable synchronous transfer of command/address information and data between the controller core and signaling interface 134.

Similarly, within each memory component, the incoming I/O clock is supplied, via receive-buffer 119 of clock receiver 111, to registers 121 within command/address receivers 113 and to registers 115, 117 within data transceivers 109. By this operation, edges of the I/O clock signal may be used to define sequential transmission intervals over the CA signaling links and data (DQ) signaling links, and thus synchronous signaling in which individual bits of CA information and read/write data are transmitted on a given CA or DQ signaling link in respective bit intervals. In the particular embodiment shown in FIG. 1 and embodiments described below, each cycle of the I/O clock is assumed to define a single bit interval (i.e., one bit may be transferred on a given signaling link per cycle of the I/O clock signal). In alternative embodiments, CA information and/or data may be conveyed in two or more bit intervals per I/O clock cycle (e.g., double-data rate transmission in which both rising and falling edges of the I/O clock, or rising edges of complementary instances of the I/O clock, are used to trigger signal transmission/reception). Also, while not specifically shown, additional control signals (e.g., chip-select signals transmitted via chip-select links, data mask signals transmitted via mask signaling links, etc.), timing signals (e.g., data strobes transmitted by the controller and/or memory components via strobe signaling links, low-speed or reference clock signals, etc.) may be conveyed between the controller and memory components. Further, while a free-running clock signal and corresponding clock link is depicted in the embodiment of FIG. 1 and a number of embodiments described below, in all such cases a non-periodic timing signal (e.g., a load signal or strobe signal) or pause-able clock signal may be transmitted instead of or in addition to a free-running clock signal to provide timing edges on an as-needed basis to trigger signaling operations and/or core operations within memory components 101.

In the embodiment of FIG. 1, the memory components 101 and control component 130 are implemented in respective integrated circuit (IC) dice or semiconductor "chips" and then packaged or assembled to form memory system 100. Referring to assembly view 160, for example, the four memory components 101[0]-101[3] (a memory component quantity carried forward in embodiments described below, though there may be more or fewer memory components in all cases) are implemented in respective IC dice and coupled to a processor IC 161 (i.e., a control component which may alternatively be an application-specific IC or any other IC having circuitry that implements a memory control function) by an array of a through-silicon-via (TSV) interconnects. That is, each memory IC has a conductive passageway that extends from one planar surface to the other, thus enabling the memory ICs to be stacked as shown. The signaling links are formed by conductive elements or materials interconnecting and extending through individual "TSV" passageways within each of the memory ICs, thereby establishing a connection to each IC in the stack. The processor 161 is disposed on a substrate 163 having electrical pathways formed therein and connected to a host interface of the processor IC (e.g., via wire bonding 162 and/or any other interconnect methodology and structure) to interconnect the host interface of the processor IC to a package interconnect structure 165 such as a pin grid array, ball grid array, etc. By this arrangement, the entire memory system may be implemented in a unified integrated-circuit package (sometimes referred to as a system in package (SIP) or multi-chip module (MCM)) and thus coupled to other components of the host system of which it is part. The host system itself may be virtually any apparatus that requires occasional data storage and retrieval including, for example and without limitation, a tablet, notebook or desktop computer; a mobile electronics device such as a mobile telephone, smartphone, global positioning system, video or still image camera; a video, still-image, music, or audio playback device or recording device; various navigational and control systems within an automobile, aircraft or other vehicle; a medical instrument, manufacturing device, appliance, robot, or any other system or assembly that includes a data or signal processing system.

Assembly view 170 illustrates an alternative memory system assembly in which each of the memory components 101 is implemented as a discrete integrated-circuit memory device, disposed on a respective memory module 171 and coupled to a control component (processor 173 in this example) via timing, command and data signaling links formed in part by traces on a printed circuit board (PCB) and, in part, by traces on the memory modules. In one embodiment, each memory module 171 includes one or more "ranks" of memory devices, with the memory devices of a given rank being selected for simultaneous read or write access (i.e., accessed in parallel as a unit) by a shared chip-select signal or other chip-select mechanism. In terms of signaling topology, the clock link and CA links may be coupled to all the memory devices of each installed memory module (each of the memory modules being, for example, removably inserted in module connectors to enable storage-capacity expansion of the memory system), while a separate set of data links is coupled in parallel to each memory device of a given rank, thereby enabling parallel, simultaneous data transfer to/from the memory devices of a selected rank. Each of the separate sets of data links may be coupled to a respective one of the memory devices within each rank of memory devices as shown, thus effecting the multiple-memory-device interconnection to common data, command and clock signaling links shown conceptually in memory system 100.

Figure 2:
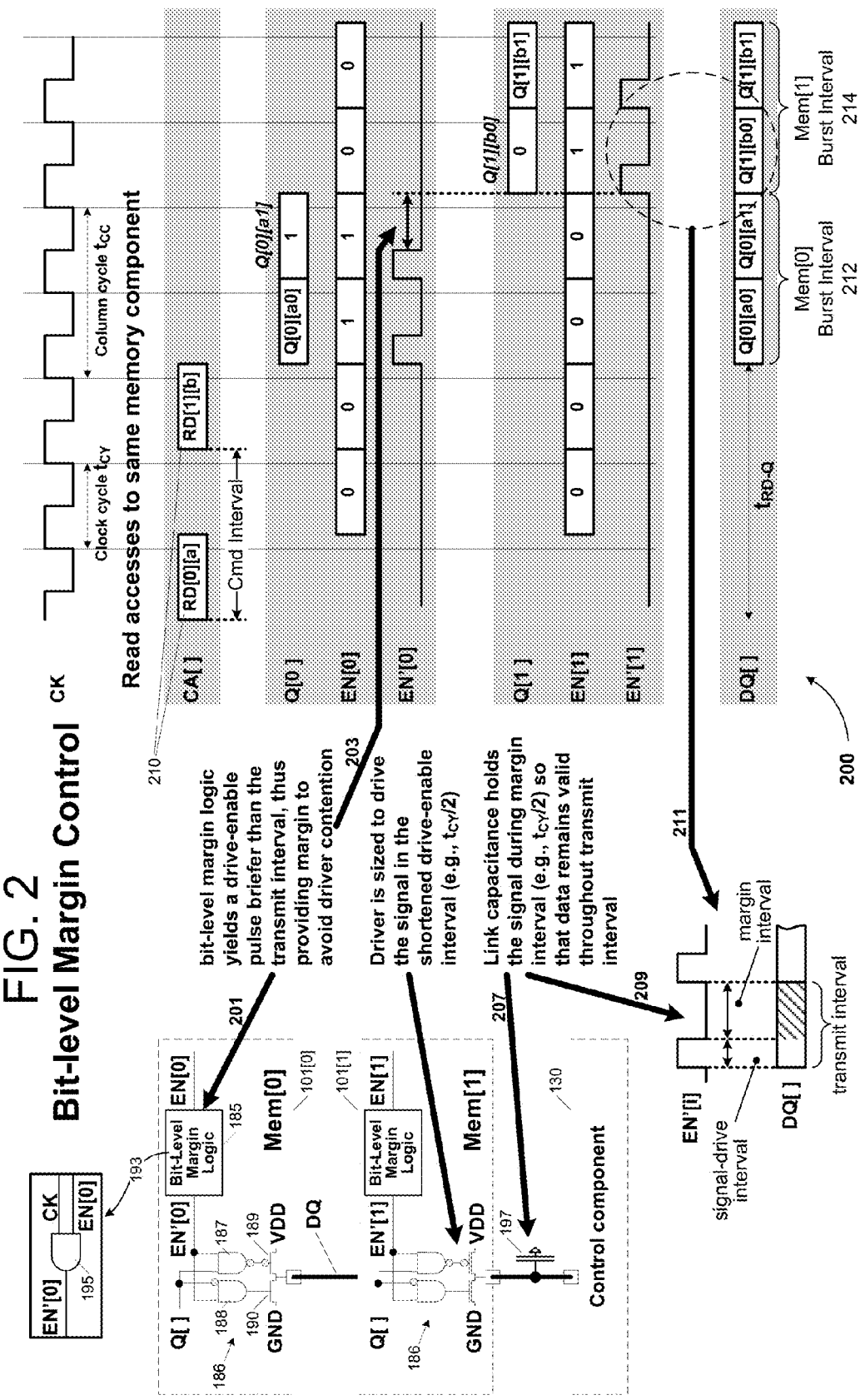
FIG. 2 illustrates exemplary bit-level logic circuitry implemented within memory components of a memory system to avoid signaling contention on a shared data signaling link.

FIG. 2 illustrates exemplary bit-level logic circuitry 185 implemented within a pair of memory components 101[0], 101[1] of a multi-memory-component memory system to avoid signaling contention on a shared data signaling link. More specifically, memory components 101[0] and 101[1] (e.g., two of the four memory components depicted in the memory system of FIG. 1 and collectively referred to herein as "memory components 100") include respective output drivers 186 coupled to a shared signaling link ("DQ") and are instructed by a processor or other control component 130 to transmit data during back-to-back burst intervals 212 and 214 (i.e., respective data transmission intervals that share a temporal boundary). Referring to timing diagram 200, the processor issues memory read commands RD[0][a] and RD[1][b] in successive memory command intervals as shown at 210 to instruct memory devices Mem[0] and Mem[1] to retrieve read data from respective addresses ([a] and [b]) and output the retrieved data in back-to-back burst intervals 212 and 214. In the particular embodiment shown, the memory components 101 are assumed to include dynamic random access memory (DRAM) cores and thus the memory read and write commands are column read and column write commands (i.e., commands to retrieve or overwrite a column of data within the larger quantity of "page" or row data transferred to a sense amplifier bank in a row activation operation), and each memory command interval ("Cmd Interval") and burst interval (e.g., 212, 214) corresponds to the column cycle time ($t_{CC}$) of the memory components (i.e., minimum time required between successive column read or write operations to an open row, and thus a constraint on the frequency with which the control component 130 may typically issue column read/write commands). While DRAM cores and corresponding command types and timing constraints are assumed in the embodiment of FIG. 2 and other embodiments described below, in all such cases, alternative memory core technologies may be employed (e.g., flash or other charge-trapping non-volatile memory, phase-change memory, magneto-resistive memory, static RAM, etc.) and command types, protocols and/or timing constraints may likewise be different from those presented herein.

Still referring to FIG. 2, command-decode logic within each of the memory components 101 (not specifically shown) responds to a respective one of the column read commands shown at 210 by executing a core access operation to retrieve the address-specified read data, Q[N–1:0], and present respective portions of the read data, Q[ ], to individual output drivers 186 for transmission to the control component via respective shared DQ links (only one of which is shown). In the example shown, each output driver 186 is enabled to transmit two data bits in successive clock cycles (i.e., bit interval or transmit interval, $t_{bit}$ is equal to the cycle time, $t_{CY}$, of I/O clock signal, CK) during a given burst interval, so that the burst length (i.e., bits transmitted in sequence during the burst interval) is two. In alternative embodiments, the ratios $t_{CY}/t_{CC}$ and/or $t_{bit}/t_{CY}$ may be higher than shown in FIG. 2 (i.e., so that the number of clock cycles per burst interval is higher and/or the number of sequentially transmitted bits per clock cycle is higher) thus yielding a correspondingly higher burst length (e.g., burst length (BL)=4, 8, 16, etc.).

As shown in timing detail 200 of FIG. 2, the output-enable signal, EN[i], within a given memory device 'i', is raised (e.g., to a logic '1') during bit intervals in which output drivers 186 within memory device Mem[i] are to transmit data, then lowered thereafter. Accordingly, in the example presented, EN[0] is raised within Mem[0] during the bit intervals that span burst interval 212, and EN[1] is raised within Mem[1] during the immediately following bit intervals that span burst interval 214. To avoid link contention that may otherwise occur at the burst-interval boundary (i.e., where timing skew may result in brief but disruptive overlap between assertion of EN[0] and EN[1]), the output-enable signal within each memory device is supplied to bit-level margin logic 185 which yields a drive-enable pulse, EN'[i] shorter in duration than the allocated bit interval, thus providing margin to avoid signaling contention as shown at 201 and 203. In one implementation, shown for example at 193, the bit-level margin logic gates the output-enable signal EN[i] with the I/O clock (e.g., in a logic AND gate 195), thereby lowering the drive-enable signal during the half-clock cycle in which the clock signal is low and thus reducing the signal-drive interval (i.e., the interval in which a given output driver is enabled to drive a signaling link) by approximately half a clock cycle. Accordingly, a "margin interval" of approximately half a clock cycle ($t_{CY}/2$) is provided as a timing margin between successive drive-enable signal assertions, including between drive-enable signal assertions in different memory devices that may otherwise result in signaling contention. Moreover, as shown at 207, 209 and 211, even though the signal-drive interval is shorter than the transmit interval, the link capacitance is generally sufficient (and may be specifically designed or increased to ensure such sufficiency) to hold the state of the signaling link established during the drive interval (i.e., high or low) during the ensuing margin interval and thus during the remaining portion of the transmit interval.

Still referring to FIG. 2, the output drivers 186 within each memory device (e.g., formed by pull-up and pull-down control gates 187, 188, and pull-up and pull-down drive transistors 189, 190 as shown in memory component 101[0]) may be sized to drive the DQ link to the necessary state in the shortened drive interval. Also, while bit-level margin logic that yields a margin interval of approximately $t_{CY}/2$ is shown, different margin intervals may be obtained by alternative margining circuits, including those that rely upon calibrated or uncalibrated delay elements, additional clock signals (e.g., the margin interval may be reduced to $t_{CY}/4$ by ANDing the output-drive enable signal with both CK and a 90°-phase advanced instance (quadrature instance) of CK). Further, though not specifically shown, circuitry may be provided to disable or bypass the bit-level margin logic 185 in response to a control setting (e.g., a control bit or control value programmed within one or more mode registers or configuration registers), thus permitting bit-level margin logic to be selectively enabled and disabled according to application needs, including dynamically enabling/disabling bit-level margining on a transaction by transaction or transmission by transmission basis.

FIG. 3 illustrates an exemplary operation of burst-level margin logic 241, 243 implemented within memory components 101 and control component 130 of a memory system to avoid signaling contention on shared data links. As shown, the control and memory components include link-interconnected signaling interfaces implemented and operated generally as described in FIG. 1, except that a mask signaling link, DM/QM, is coupled between memory-side and control-side transceivers 244 and 246 to enable bidirectional signaling instead of merely unidirectional data-mask (DM) signaling. Though not specifically shown, command/address signaling circuitry and corresponding command/address links (CA) are provided generally as shown in FIG. 1.

In one embodiment, the burst-level margin logic 241, 243 is selectively enabled within the memory and control components 101, 130 to effect either a legacy signaling mode or a burst-margin mode, shown in exemplary timing diagrams 270 and 285, respectively. In legacy signaling mode, a bubble (i.e., time interval in which output drivers within all memory and control components are nominally disabled from outputting signals onto shared data links) is inserted between successive burst intervals allocated to different devices (Mem[0] and Mem[2] in the example shown at 270) to avoid signaling link contention. In one embodiment, the bubble insertion is effected by the control component itself, for example, by inserting delay between output of successive memory access commands directed to different memory components and thus, as shown by the bubble that appears following the "Mem [0] Burst Interval" and before the "Mem[2] Burst Interval," delaying the latter of the two burst intervals by a bit-interval as shown. As discussed, the bubble insertion reduces the effective signaling bandwidth of the link (i.e., constitutes wasted signaling bandwidth) and increases memory latency. Further, though a single-bit-time bubble is shown, the bubble may actually span numerous bit intervals (e.g., a column cycle interval, $t_{CC}$), particularly when established by relatively coarse timing-granularity logic within control component 130.

When the memory components are operated in burst-margin mode, burst-level margin logic 241 selectively reformats the output data burst to enable the output drivers to be disabled during a bit interval that occurs at the beginning or end of a burst interval, thereby avoiding link contention when back-to-back burst intervals are allocated to different memory components without requiring bubble insertion between those intervals. That is, depending upon the burst mode specified in an incoming memory read command (or determined by other conditions and/or events as discussed below), burst-level margin logic 241 outputs read data corresponding to the memory read command in either an abbreviated-burst format or standard burst format. In the particular embodiment shown, for example, the burst-level margin logic (also referred to herein as "burst-margin logic") may re-route a set of read data bits that are otherwise to be transmitted in parallel via data links DQ[7:0] during the leading bit interval of a data burst (i.e., first bit interval of the allocated burst interval) to instead be transmitted serially on the data-mask link during subsequent bit intervals. Because the data-mask link would otherwise remain unused during the read-data burst interval (i.e., used instead only to convey write masking information during memory write operations), the data-mask link may be commandeered for read data transmission without creating a resource conflict, and thus enable data transmission using the abbreviated-burst format without requiring additional signaling links. By this operation, a contention-avoiding margin is effected within the burst interval itself (i.e., by disabling the output drivers during the leading bit interval thereof) and thus without costly bubble insertion or substantial changes within the memory components and control component. More specifically, the primary change within the control component 130 and memory components 101, aside from the addition of burst-level margin logic, is the addition of a memory-side output driver and control-side receiver to enable bi-directional signaling over the data-mask link. Accordingly, the data-mask link is referred to herein as the DM/QM link to reflect the occasional transfer of read data thereon (and optionally, as described below, write data) in addition to mask information.

In the particular embodiment of FIG. 3, the quantum of read data or write data transferred over a given set of eight data links (DQ) in a memory read or memory write operation is assumed to be 64 bits (i.e., Read data[63:0] or Write data [63:0]). Accordingly, the data burst interval, which is assumed to be coextensive with the column cycle time, $t_{CC}$, is subdivided into eight bit intervals ($t_{bit}$) during each of which, in the standard-burst transmission format at least, eight data transceivers 109 within a memory component 101 (during a read operation) or control component 130 (during a write operation) are enabled to output respective data bits onto signaling links DQ[7:0]. In the abbreviated burst format, by contrast, the eight data links are only driven for seven of the eight available bit intervals (the leading or lagging bit interval constituting a margin interval during which output drivers for all DQ links are, for example, tri-stated) within a given data burst interval, and the DM/QM link is used to serially convey the bits otherwise transferred in the margin interval. Moreover, this basic footprint of eight DQ links and a DM/QM link may be replicated as necessary to achieve a wider, higher-bandwidth signaling interface (e.g., replicated in tens or even hundreds of instances, particularly in a TSV-based topology that enables a large number of chip-to-chip signaling links at relatively low cost).

Still referring to FIG. 3, it can be seen that the eight "margin" bits 'a' through 'h' that are re-directed for serial transmission on the QM/DM link (i.e., link QM[0] from the perspective of the transmitting memory device) extend beyond the boundary of the burst interval to which they correspond, with the final bit in the margin sequence (i.e., bit 'h') being transmitted during the leading interval of a subsequent burst interval. In the particular embodiment shown, the abbreviated-burst transmission is followed by a standard-burst transmission from the same memory device, so no contention with respect to the DQ links or DM/QM link results from this boundary-crossing transmission of the final margin bit. Moreover, in an embodiment in which each DRAM row activation is followed by at least two back-to-back column access operations within the activated row, the abbreviated-burst format may be selected for the initial (or final) one of the column access operations and the standard-burst format for all others, thereby ensuring that no contention will occur on the DQ links or DM/QM links for any read transaction pattern, regardless of the addressed memory component. By contrast, if a solitary burst interval may be allocated to a given memory component and sandwiched between burst intervals allocated to one or more other memory components (e.g., as would occur in the case of back-to-back-to-back memory access commands in which the sandwiched command is directed to a different memory component than the one before or after), then contention in two abbreviated bursts becomes possible as the boundary-crossing margin bit ('h') in the first abbreviated-burst output will be transmitted back-to-back with the leading margin bit ('a') in the subsequent abbreviated-burst output. While this scenario may be tolerated in some applications (i.e., as being substantially less problematic than the potential contention that results in all eight DQ links if back-to-back standard bursts from different memory components was permitted), the controller may also take action to avoid such events, for example, by inserting a bubble between such sandwiched burst interval allocations. While bubble insertion is generally undesirable for the reasons described, its use in low-probability scenarios (e.g., where the majority of the column accesses are directed in pairs (or larger numbers) to the same activated row and thus to the same memory device) may be acceptable in some applications.

While bubble insertion may be established by control component 130 (e.g., delaying command transmission time by adding a bit interval or column cycle interval of delay between transmission of successive memory read commands to avoid potential contention), burst-level margining is effected by burst-level margin logic within the data-transmitting component itself. More specifically, burst-level margin logic 241 (and/or burst-level margin logic 243) includes circuitry to output data in either the abbreviated-burst or standard-burst data transmission formats, steering the margin bits to either the DQ output drivers or the DM/QM output driver (or both) and selectively enabling the DQ output drivers and/or DM/QM output driver according to the selected burst format. Thus, while the bubble insertion depicted in legacy mode timing diagram 270 is effected through memory component idling (i.e., no data to be transmitted during the bubble interval due to incoming command timing and thus the simultaneous low state of the output-enable signals, EN[0] and EN[2], for the two commanded memory components), the margin interval is established in the burst-margin mode through suppression of one or more output-enable signals during the leading bit interval of the allocated burst interval (i.e., output-enable signal EN[0] is driven low during the leading bit interval, and is thus simultaneously low with the counterpart output-enable signals for the other memory components, EN[1], EN[2] and EN[3], as those memory components have not been commanded to output data).

Reflecting on the embodiment of FIG. 3, it should be noted that the serial margin bit transmission may alternatively be conveyed on a signaling link dedicated for that purpose (i.e., instead of a link also used to convey write-masking information). Moreover, any unused signaling link, including an idle link used at other times or in other configurations to convey command/control, address and/or timing information, may be temporarily employed or "borrowed" to transmit one or more margin bits within a burst-margined transmission. Further, as discussed below in reference to FIGS. 4A-4C, multiple DM/QM signaling links (and/or dedicated links such as DS/QS links or other borrowed signaling links such as CA links, timing links, etc.) may be provided to serially convey margin bits in accordance with various burst-lengths and interface widths. Accordingly, while a single set of eight DQ links and a single DM/QM link are shown in FIG. 3, multiple sets of eight DQ links (or other larger or smaller groupings of DQ links) may be provided, together with additional DM/QM links and/or dedicated margin-bit signaling links. Also, to avoid obscuring depicted features, neither the CA signaling links and corresponding interface circuitry, nor core circuitry within the control and memory components are shown in FIG. 3.

Figure 4A:
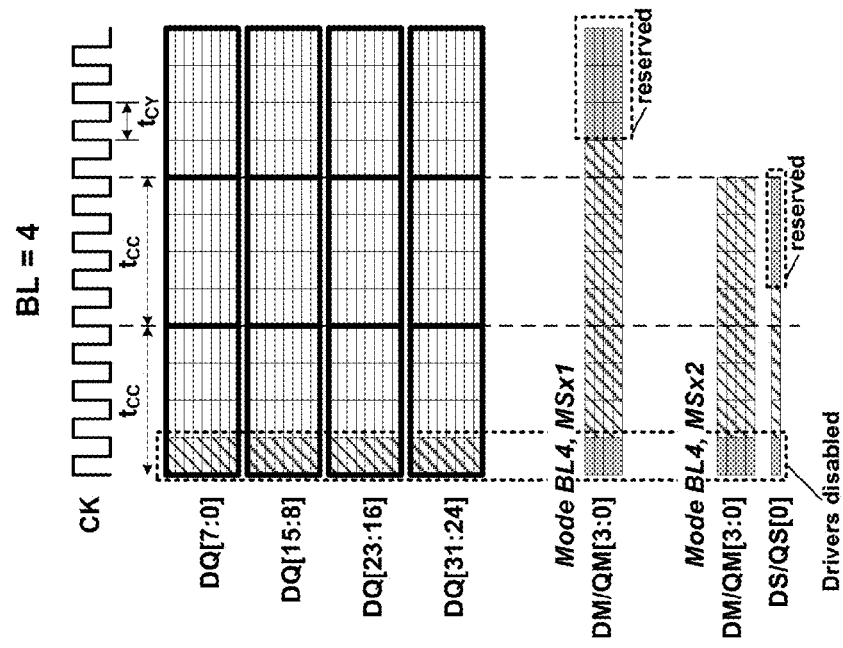
FIGS. 4A, 4B and 4C illustrate exemplary burst-margined formats (i.e., abbreviated formats) that may be employed to avoid link contention.
Figure 4B:
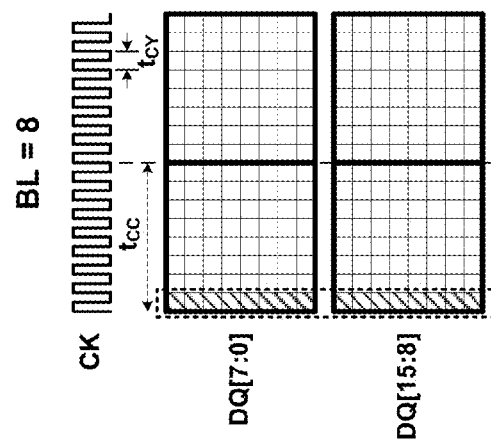
Figure 4C:
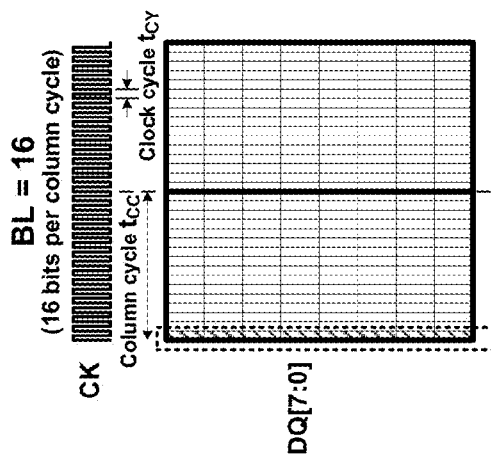

FIGS. 4A, 4B and 4C illustrate exemplary burst-margining formats (i.e., abbreviated formats) that may be employed for respective burst lengths of 16, 8 and 4. The examples shown assume a constant 16-byte (128-bit) column access granularity, though different access granularities may apply in alternative implementations. Referring first to the BL=16 case shown in FIG. 4A, it can be seen that eight margin bits may be transmitted during bit intervals 1-8 on a single margin-bit link (DM/QM in this example), thereby enabling all data output drivers to be disabled during the leading bit interval (bit interval 0) without extending the serial transmission of margin bits across the burst interval boundary (i.e., column cycle boundary). Accordingly, when the memory system is configured to transfer data in 16-bit burst lengths, the abbreviated data format may be employed in every read data transmission without conflict, or in selective read data transmissions (e.g., leading memory read command following a row activation) as shown.

In FIG. 4B (BL=8), two different sets of eight data links are illustrated to demonstrate two alternative margin-bit streaming modes (or "margin streaming" (MS) modes). In a single-stream mode, MSx1, the margin bits for each set of eight data links are serially transmitted on a single, respective margin-bit link. This is the approach shown in FIG. 3, with the DM/QM link being employed as the margin-bit link. In the second margin streaming mode, referred to herein as a "dual-stream" mode (MSx2), the margin bits for each set of data links are transmitted on two margin-bit links. More specifically, the boundary-crossing margin bit (i.e., the margin bit transmitted during the first bit interval of a subsequent burst interval, designated bit 'h' in FIG. 3) within each of set of eight margin bits is serially multiplexed with the other boundary-crossing margin bit on a surplus signaling link, DS/QS (not to be confused with a data strobe link, DQS, which may also be present), thereby enabling each set of eight margin bits to be transmitted within the confines of a single burst interval (i.e., in the seven bit intervals that follow the margin interval). Accordingly, burst-level margining is achieved in a manner that permits the abbreviated format to be selected for each set of eight signaling links in each and every memory access (if desired) at the cost of only one additional signaling link. Moreover, as the DS/QS signaling link is unused in bit intervals 3-7 of the dual-stream format, individual margin bits from as many as five more sets of eight DQ links may also be time-multiplexed onto the surplus signaling link without crossing the burst interval boundary.

FIG. 4C (BL=4), four different sets of eight data links are illustrated to demonstrate alternative single and dual margin-bit streaming modes. In single-stream mode, MSx1, the margin bits for each set of eight data links are serially transmitted on a respective margin-bit link (i.e., a respective one of links DM/QM[3:0] in the example shown) and thus over an interval that extends across not one but two burst interval boundaries. In dual stream mode, MSx2, by contrast, respective margin bits from each set of eight margin bits are serially transmitted (i.e., time multiplexed) on a surplus signaling link, DS/QS ("QS[0] in FIG. 4C), thereby enabling each set of eight margin bits to be transmitted within the confines of two burst intervals instead of three. Where memory read operations are carried out exclusively or predominantly in pairs of successive column read operations per row activation, confining the margin bit transmission to two burst intervals ensures that link contention may be avoided or at least limited in the memory read pipeline; a benefit achieved at the cost of only one additional signaling link (DS/QS) for the 32 DQ links and four DM/QM links shown. Also, because the DS/QS signaling link is unused in bit intervals 1-3 of the second burst interval spanned by the dual-stream format, individual margin bits from as many as three more sets of eight DQ links may also be time-multiplexed onto the surplus signaling link without further boundary crossing, thus extending the benefit of the additional signaling link without substantial cost.

FIG. 5A illustrates an embodiment of a burst-margin logic circuit 315 that may be used to implement burst-level margin logic 241 within memory components 101 of FIG. 3. As shown, burst-margin logic 315 includes steering logic 319 for routing read and write data bits between a set of signal transceivers 325 and a memory component core 321, as well as margin control logic 317 that controls the operation of steering logic 319 and transceivers 325. In the embodiment shown, margin control logic 317 is coupled to receive configuration (Cnfg), request (Req), clock (CK) and chip-select signals (CS) from command-decode logic or other control logic within the host memory component (and/or directly from the signaling interface formed, at least in part, by transceivers 325), and outputs select signals (Sel) to steering logic 319 and enable (EN) signals to transceivers 325.

For purposes of example, burst-margin logic 315 is assumed to transfer a 32-byte "memory word" (i.e., 256 bits in all) between signal transceivers 325 and memory core 321 per memory access operation, with each memory word including four 8-byte sub-words (RD/WD[3][63:0]-RD/WD[0][63:0]) that are conveyed between the memory core 321 and steering logic 319 via respective data lanes. The signal transceivers 325 include four groups of data transceivers (DQ7-DQ0), four data-mask transceivers (DM/QM) and a surplus transceiver (DS/QS). Each of the four groups of eight data transceivers together with a corresponding one of the data-mask transceivers, constitutes a byte-wide interface (only one of which is shown in FIG. 5A) for transmission and reception of the constituent bytes of a respective 8-byte sub-word. More specifically, in an 8-bit burst-length, legacy signaling mode, burst-margin logic 315 supplies the constituent bytes of an 8-byte read-data sub-word (e.g., RD[0][63:0]) to the eight data transceivers of the byte-wide interface and enables the DQ transceivers to transmit those eight bytes via links DQ0-DQ7 in respective bit-intervals, $t_{bit}[0]$-$t_{bit}[7]$. For example, steering logic 319 supplies read-data bits Q[7]0-Q[0]0 (collectively, Q[i]0) in succession to the DQ0 transceiver, and margin control logic 317 raises enable signal EN[0] to enable the DQ0 transceiver to transmit those bits via the DQ0 link in respective bit intervals (i.e., marked by transitions in I/O clock signal, CK). Steering logic 319 similarly provides bits Q[i]1-Q[i]7 in succession to the DQ1-DQ7 transceivers, respectively, and the EN[0] signal raised by margin control logic 317 is also supplied to those transceivers to enable 8-bit burst transmissions on each of links DQ1-DQ7 during bit intervals tbit[0]-tbit[7].

Though not specifically shown in FIG. 5A, burst-margin logic 315 also supplies the constituent bytes of each of the other three 8-byte sub-words to respective sets of data transceivers for transmission during those same eight bit-intervals over respective groups of eight DQ links, thus effecting a 32-byte read data transfer during a given column cycle interval, $t_{CC}$. In a legacy-mode write operation, the eight bytes of each of four 8-byte write-data sub-words are received via a respective group of eight data transceivers, with a sequence of mask bits, one for each of the eight write data bytes received via the data links, optionally being received via the corresponding data-mask link.

When a single-stream burst-margin mode is selected for 8-bit burst length transfers (MSx1, BL=8), burst-margin logic 315 enables the data (DQ) transceivers for a given byte-wide interface to transmit data during only seven of the eight available bit intervals and enables the margin bits (i.e., the bits otherwise transmitted in the leading or trailing bit interval) to be serially transmitted by the DM/QM transceiver, thus effecting the single-margin-stream, abbreviated burst format shown in FIG. 4B. Further, when a dual-stream burst-margin mode is selected for 8-bit burst length transfers (i.e., MSx2, BL=8), burst-margin logic 315 again enables seven bytes of read data to be transmitted by the data transceivers in seven of the eight available bit intervals, but the margin bits are split between the DM/QM transceiver and the surplus (DS/QS) transceiver, with the DM/QM transceiver being enabled to transmit seven of the eight margin bits (i.e., concurrently with DQ-link transmission of the other seven read data bytes) and the DS/QS transceiver being enabled to transmit the eighth, boundary-crossing margin bit in time-multiplexed fashion with the eighth margin bits of the other three byte-wide interfaces. (e.g., as shown by the dual-stream abbreviated burst format in FIG. 4B).

Still referring to FIG. 5A, if a 16-bit burst-length is specified, burst-margin logic 315 enables the DQ transceivers for a given byte-wide interface to transmit data during only fifteen of the sixteen available bit intervals and enables the eight margin bits to be serially transmitted by the DM/QM transceiver (or a transceiver for a dedicated margin-bit link), thus effecting the single-margin-stream abbreviated burst format shown in FIG. 4A. Because the eight bit intervals required to transmit the margin bits are fully contained within the burst interval (i.e., within the fifteen drive-enable bit intervals of the margined burst interval), there is no need for a multi-stream margin bit transmission. By contrast, if a 4-bit burst length is specified, burst-margin logic 315 enables the DQ transceivers for a given byte-wide interface to transmit read data during only three of the four available bit intervals. Consequently, at least three back-to-back burst intervals are allocated to the margining memory component to enable DM/QM transmission of the eight margin bits (i.e., three bits being transmitted in the margined burst, and the remaining five bits being transmitted in accompaniment with standard-format burst outputs of not just one but two subsequent burst intervals). When dual-margin-streaming mode is selected (i.e., MSx2, assuming the same burst length, BL=4), the margin bits are split into two streams, with seven margin bits being transmitted via the DM/QM transceiver during the margined burst and the immediately following standard-format burst, and the final margin bit being time-multiplexed with final margin bits from four other byte-wide interfaces onto the surplus link DS/QS.

FIG. 5B illustrates an exemplary set of transceivers that may be used to implement the byte-wide physical signaling interface (PHY) described in reference to FIG. 5A, including eight data transceivers 359[7:0] (only two of which are shown), data-mask transceiver 365 and optional surplus transceiver 367. As shown, each transceiver, 359, 365, 367 includes input and output data registers 368 and 369 clocked by a common clock signal (or, alternatively, by a synchronized set of clock signals) and coupled respectively to a signal receiver 370 and output driver 371. The output driver 371 within each of the data transceivers 359 (DQ0-DQ7), is enabled by a common driver-enable signal, EN[0], and the output drivers within the data-mask transceiver 365 (DM/QM) and surplus transceiver 367 (DS/QS) are enabled by respective data-mask and surplus driver-enable signals, EN[1] and EN[2]. By this configuration, the burst-margin logic can selectively transition the data, data-mask and surplus driver-enable signals from bit interval to bit interval to enable constituent transceivers of the byte-wide interface to output signals via respective pads 372 (or other interconnects) and thereby effect a given burst format. Though not shown, receiver-enable signals may also be provided to the signal receivers 370, thus enabling the receivers to be selectively enabled or disabled (e.g., to reduce power consumption and/or switching noise) according to whether signals are to be received via their respective links in a given bit interval. Also, the same driver-enable signals (and/or receiver-enable signals) may be fanned out to (or replicated for) each byte-wide interface in the memory component, thus enabling an overall memory word, or even multiple memory words to be received or transmitted in selected burst formats.

FIG. 5C illustrates an embodiment of a steering logic circuit 380 that may be used to implement steering logic 319 in FIG. 5A. Conceptually, steering logic 380 may be viewed as having a set of sub-word logic circuits 381[0]-381[3] (generally, "381"), each dedicated to delivering the bits of an eight-byte read-data sub-word (e.g., RD[0][63:0]) to the data and data-mask transceivers of a given byte-wide interface, and a multiplexing logic circuit 383 to deliver selected margin bits of respective read-data sub-words to the surplus transceiver for time-multiplexed transmission via the surplus signaling link (DS/QS).

In the embodiment shown, each sub-word logic circuit 381 includes a byte multiplexer 387 and bit multiplexer 389 coupled to receive a three-bit select signal, Sel[2:0], from the margin-control logic. Byte multiplexer 387 has eight byte-wide inputs, each coupled to receive a respective byte (Byte 0-Byte 7) of a read-data sub-word and may thus deliver a selected byte of the read-data sub-word to the DQ transceivers of the corresponding byte-wide sub-word interface (i.e., each bit of the selected byte being delivered to a respective one of the data transceivers). By this arrangement, the margin control logic may step the select signal through the eight different select values in respective bit intervals to select each byte of the read-data sub-word to be delivered to the data transceivers in turn over a given burst interval.

In the particular example shown, byte 0 of a given read-data sub-word (i.e., RD[0][7:0] in the first read data sub-word) is the first byte transmitted when standard-burst format is selected (i.e., byte 0 constitutes the leading byte of the burst interval) and also constitutes the margin byte during burst-margined transmissions. Accordingly, the constituent bits of byte 0 (the margin bits) are supplied to 8:1 bit multiplexer 389, to enable their sequential delivery to the data-mask transceiver as the select signal is stepped through its eight possible states in respective bit intervals. The order in which the margin bits are transmitted via the DM/QM link may be effected by their interconnection to the bit multiplexer inputs. For example, in one embodiment, margin bits 0-6 are coupled to inputs 1-7 of bit multiplexer 389, and final margin bit, 7, is coupled to bit multiplexer input 0, thereby effecting transmission of the margin bits in order of significance (starting at margin bit 0 and concluding with margin bit 7) when a single-stream abbreviated-burst margining format is selected.

Still referring to FIG. 5C, multiplexing logic 383 includes a 4:1 bit-multiplexer 391 coupled to receive the final margin bit from each of the four read-data sub-words and thus, in the particular example shown, bit RD[0][7] from sub-word RD[0][63:0], bit RD[1][7] from sub-word RD[1][63], bit RD[2][7] from sub-word RD[2][63] and bit RD[3][7] from sub-word RD[3][63]. By this arrangement, bit multiplexer 391 may deliver the final margin bit from each read-data sub-word to the surplus (DS/QS) transceiver during a respective bit interval to enable time-multiplexed transmission of those final margin bits (e.g., boundary-crossing margin bits) when dual-margin streaming modes are selected.

Comparing the structure of steering logic 380 with the abbreviated burst formats shown in FIG. 4A-4C, it can be seen that when burst-lengths less than eight are selected (e.g., BL=4), not all of the inputs to byte multiplexer 387 and bit multiplexer 389 need be used. In one embodiment, for example, the margin control logic responds to selection of the single-stream, burst-length 4 mode (i.e., MSx1, BL=4), by generating a modulo-4 select signal (i.e., holding the most significant select bit, Sel[2], low so that the select value increments from 0 to 3 and then rolls over to 0), thus selecting the four bytes of a 4-byte read-data sub-word in sequence during a given burst interval, and then repeating that selection sequence in then next burst interval. In that case, additional logic may be provided to buffer the bits of the margin byte as necessary to supply those bits to the four-used inputs of bit multiplexer 389 (and bit multiplexer 391 in dual-stream margining modes) during subsequent burst intervals (e.g. selecting a low-order nibble (4-bits) for transmission during the last three bit intervals of a margined burst, and the first bit interval of a subsequent burst interval, and then selecting the high-order nibble for transmission in subsequent bit intervals). Conversely, when a burst-length greater than eight is selected, multiple 8-byte read data sub-words may be supplied to the steering logic per burst interval. For example, when a 16-bit burst length is selected (BL=16), two 8-byte halves of a 16-byte read-data sub-word may be supplied to steering logic 380 in respective halves of a column cycle interval. In that case, the initial 8-byte half of the read-data sub-word may be output in a burst-margined format, followed by standard-format output of the second 8-byte half of the read-data sub-word (e.g., with the final margin bit being transmitted via the DM/QM link concurrently with transmission of the leading byte of the second half-sub-word via the DQ links).

Figure 6:
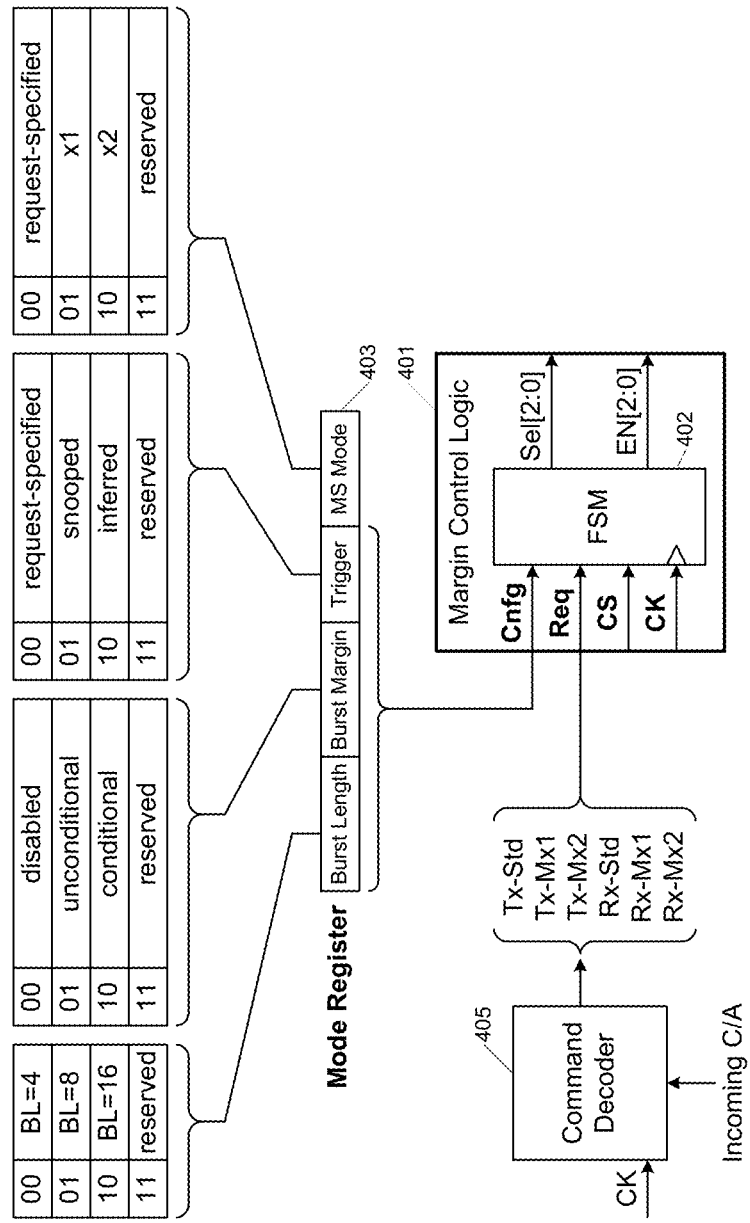
FIG. 6 illustrates an embodiment of a margin control logic circuit that may be used to implement margin control logic of FIG. 5A, together with a mode register (or configuration register or configuration circuit) that may be programmed to select or control various aspects of a burst-margined transmission.

FIG. 6 illustrates an embodiment of a margin control logic circuit 401 that may be used to implement margin control logic 317 of FIG. 5A, together with a mode register 403 (or configuration register or configuration circuit) that may be programmed to select or control various aspects of the burst-margining operation. As shown, the margin control logic 401 is implemented by a finite state machine 402 having inputs to receive a configuration value ("Cnfg") containing information programmed within mode register 403 (which may be implemented by multiple separately programmable registers), a request value ("Req"), and/or a chip-select value ("CS").

State machine 402 transitions from state to state in response to I/O clock signal (CK) and in accordance with its state during a given clock cycle and the state of its inputs. The configuration value is used to specify various aspects of data transmit and receive operations, including the burst-length (BL), the burst margin mode ("Burst Margin"), the trigger mode ("Trigger"), and the margin-streaming mode ("MS mode"). These control values permit a host device (or production time programming system) to specify whether burst-margining is to be permanently disabled (i.e., standard burst format applied for all data transmissions), unconditionally enabled (i.e., abbreviated burst format applied for all data transmissions) or dynamically enabled. If burst-margining is dynamically enabled, the margin control logic selectively applies either a standard burst format or the abbreviated burst format according to a triggering source indicated by the triggering mode. In the embodiment shown, the triggering source may be either request-specified, snooped information or inferred based on lack of command or other event or non-event. If the trigger mode indicates that the margining trigger is request-specified, the margin control logic evaluates the request value (e.g., one or more bits supplied within or derived from an incoming command/address value) to determine whether an incoming or outgoing data transmission is to be received/transmitted in an abbreviated burst format or standard burst format. Thus, the control component may dictate whether burst-margining is to be applied within a given transmission by encoding the corresponding memory access command to specify burst-margining or not. By contrast, if the trigger mode indicates that the margining trigger is to be snooped, margin control logic 401 may monitor the chip-select signal in conjunction with the request value to determine if a transaction issued to another memory component will yield a potential contention with an output of the host memory component and, if so, select an abbreviated burst format to avoid contention. For example, if the request value indicates that a standard format memory read request has been issued by the control component for a given burst interval, and the chip-select value indicates that the read request has been issued to a memory component other than the host memory component (i.e., the memory component of which the subject margin control logic 401 is a part), then margin control logic 401 may select an abbreviated burst format in response to a memory read request issued to the host memory component for the immediately succeeding burst interval.

If inferred triggering mode is selected, margin control logic 401 may infer that a burst-margined (i.e., abbreviated burst format) output is to be transmitted in response to a memory read command if a predetermined amount of time has passed without receipt of a memory access command within the host memory component. For example, if the time elapsed without receipt of a memory access command is sufficient for a memory access command to have been issued to another memory component, margin control logic 401 may infer, as a contention-avoidance measure, that another memory access command was in fact issued to another memory component and thus select abbreviated burst format (i.e., burst-margined output) in response to a memory access command subsequently directed to the host memory component. By contrast, if a sequence of memory access commands corresponding to successive burst intervals is directed to the host memory component, the margin control logic may safely apply the standard burst format for data transmission (or reception) in each burst interval after the first.

For each of the foregoing trigger modes, margin control logic 401 operates deterministically, thus enabling the control component to apply the same trigger-mode logic to anticipate the format of a given read data burst, or, as discussed below, a write data burst. In alternative embodiments, additional or different triggering modes may be applied. Also, the triggering mode may be fixed by design (e.g., request-specified) rather than specified by a programmable register or configuration circuit.

Still referring to FIG. 6, the margin-streaming mode indicates whether single-stream or dual stream margin bit transmission is to be effected. Accordingly, if an abbreviated burst format is to be applied (i.e., margining enabled by burst margin mode setting and, if dynamically enabled, margining trigger indicates abbreviated burst format), the margin streaming mode is used to control the number of margin bit streams to be transmitted. As shown, the margin streaming mode may be transmitted in the request value ("request-specified") or specified directly by the streaming mode setting within the register.

In one embodiment, at least six different request values may be generated or forwarded by a command decoder 405 (e.g., at a time appropriate to read data transmission or write data reception) in accordance with an incoming command, including standard-format data transmit and data receive request values, "Tx-Std," "Rx-Std"), single-stream margined (abbreviated-format) data transmit and receive request values, "Tx-Mx1," "Rx-Mx1") and dual-stream margined data transmit and receive request values "Tx-Mx2," "Rx-Mx2"). If the streaming mode is directly specified by the mode register (i.e., streaming modes "x1" or "x2" is selected), the register-specified streaming mode is applied regardless of which of two different margined data-transmit request values or data-receive request values are received by margin control logic 401.

FIGS. 7A-7E illustrate the select and enable signal outputs from the margin control logic of FIG. 5A (or 5C) for different burst-length selections and margin-streaming modes when burst-level margining is enabled. In FIG. 7A, for instance, exemplary states of the select and enable signals generated by the margin control logic during each bit interval of a margined, 16-bit-burst-length read data-output are depicted. As shown, the select signals are incremented in each bit interval to select a different data entity within the various multiplexers of the steering logic (i.e., as shown and described in reference to FIG. 5C). Also, a leading-edge margin (as opposed to a trailing-edge margin) is effected in bit interval 0 by lowering all driver-enable signals (EN[2:0] in this example), though a trailing-edge margin could be generated (i.e., in the final bit interval) in an alternative embodiment. The data-driver enable signal, EN[0] is shaded in bit interval 0 to emphasize that no data output occurs over the DQ links, and the state of the DM/QM enable signal (EN[1]) is shaded in the succeeding eight bit intervals to emphasize that the margin bits are instead transmitted via the DM/QM link during bit intervals 1-8. Because the margin bits may be serially transmitted within the 16-bit burst interval, no dual margin bit streaming is required and thus the surplus driver-enable signal, EN[2], remains low throughout the margined burst interval.

FIG. 7B illustrates exemplary states of select and enable signals generated by the margin control logic during each bit interval of a margined 8-bit-burst-length, single-margin-stream output (BL=8, MSx1). Again, a leading-edge margin interval is established by disabling all output drivers during bit interval 0, and the margin bits are serially transmitted in the ensuing burst intervals in a single stream over the QM/DM link. As explained above, in this margining mode, the final bit of the margin-bit stream is transmitted concurrently with the first byte of a subsequent burst and thus the margin bit stream extends across a burst interval boundary. As shown in FIG. 7C, which illustrates exemplary states of select and enable signals generated by the margin control during each bit interval of a margined 8-bit-burst-length, dual-margin-stream output (BL=8, MSx2), the margin bits may alternatively be serially transmitted in two streams: one stream including bits 0-6 via the DM/QM link, and another stream including bit 7 via the surplus (DS/QS) link. In the particular example shown, it is assumed that boundary-crossing margin bits (i.e., margin bit 7 in one example) from two different byte-wide signaling interfaces are multiplexed onto the surplus link (hence the second, unshaded instance of a logic '1' surplus driver enable signal).

FIG. 7D illustrates exemplary select and enable signals generated by the margin control logic during each bit interval of a margined 4-bit-burst-length, single-margin-stream output (BL=4, MSx1). Again, a leading-edge margin interval is established by disabling all output drivers during bit interval 0, and the margin bits are serially transmitted in the ensuing burst intervals in a single stream over the QM/DM link. As discussed, in this margining mode, margin bits 0-2 are transmitted during the margined burst interval, margin bits 3-6 are transmitted concurrently with a standard-format read data burst during the immediately succeeding burst interval, and margin bit 7 is transmitted concurrently with the first byte of a second standard-format read data burst during a third burst interval. As shown in FIG. 7E, which illustrates exemplary states of select and enable signals generated by the margin control logic during each bit interval of a margined 4-bit-burst-length, dual-margin-stream output (BL=4, MSx2), the margin bits may alternatively be serially transmitted in two streams: one stream including bits 0-6 via the DM/QM link (thus spanning only two burst intervals instead of three), and another stream including bit 7 via the surplus (DS/QS) link. In the particular example shown, it is assumed that the final margin bits from each of four different byte-wide signaling interfaces are multiplexed onto the surplus link (hence the three unshaded logic '1' instances of the surplus driver enable signal).

Figures 8, 9:
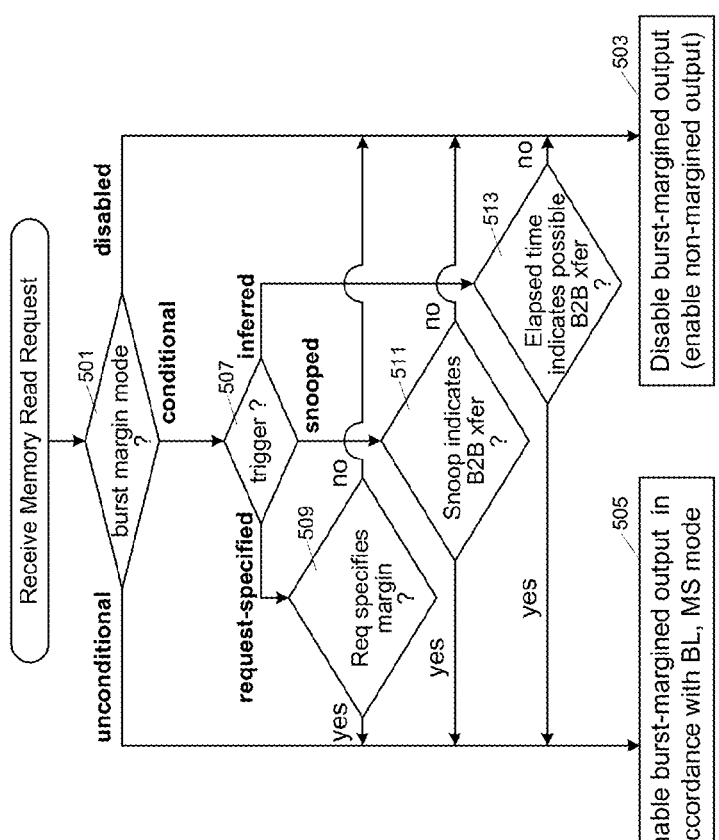
FIG. 8 illustrates a conceptual view of the operations carried out by the margin control logic of FIG. 6 in response to incoming memory read requests.
FIG. 9 illustrates a sequence of operations that may be carried out by a control component (e.g., element 130 of FIGS. 1-3) to selectively enable margined transmissions within various attached memory components.

FIG. 8 illustrates a conceptual view of the operations carried out by the margin control logic of FIG. 6 in response to incoming memory read requests. Starting at 501, if the burst margin mode indicates that margining is disabled, the margin control logic issues select and enable signals as necessary to establish a standard burst format as shown at 503 (i.e., enabling a non-margined output during the burst interval). Conversely, if the burst margin mode indicates unconditional margining, then the margin control logic issues select and enable signals as necessary to establish a burst-margined output (i.e., abbreviated burst format) in accordance with the burst-length (BL) and margin-streaming (MS) mode as shown at 505. If the burst margin mode indicates conditional margining, then the trigger mode is evaluated at 507. If the trigger mode indicates request-specified margining, then the margin control logic evaluates an incoming request value at 509 (i.e., a value extracted from or otherwise generated based on the memory read command and/or a parameter associated therewith), and enables either a burst-margined output (505) or a non-margined output (503) accordingly. If the trigger mode indicates snoop-triggered margining, then the margin control logic evaluates the state of incoming request values and corresponding chip-select signals at 511 to determine whether a memory read request directed to the host memory component will yield a data burst output over a burst interval that temporally abuts (i.e., is back-to-back with) a burst interval allocated to another memory component (i.e., snooping the request stream to detect a potential contention). If the request stream indicates back-to-back burst intervals have been allocated to the host memory component and another memory component, the margin control logic enables burst-margined output (505) to avoid contention. Otherwise, the margin control logic disables burst-margined output at 503. If the trigger mode indicates inferentially-triggered margining, then the margin control logic determines whether the amount of time elapsed since the last data receive or transmit operation with respect to the host memory component is greater than a burst interval at 513 and, if so, enables burst-margined output (505) on the conservative inference or assumption that a burst interval was in fact allocated to another memory component and thus that a standard-format burst may produce signaling contention. By contrast, if the elapsed time since last data transfer with respect to the host memory component is shorter than the burst interval employed within the memory system, the burst-margin logic may disable burst-margined output (503).

FIG. 9 illustrates a sequence of operations that may be carried out by a control component (e.g., element 130 of FIGS. 1-3) to selectively enable margined transmissions within various attached memory components. At 519, the control component determines the characteristics (e.g., capabilities, requirements, etc.) of the memory population (i.e., the set of attached memory components) by retrieving (e.g., reading) characterizing information from a configuration data source, such as a non-volatile serial-presence-detect (SPD) memory. At 521, the control component determines or chooses a margining mode according to the memory component and/or system characteristics indicated by the characterizing information and then, at 523 and 525, configures or programs the controller-side margin logic and memory component margin logic, respectively, in accordance with the determined/chosen margining mode. As an example, if all attached memory components are capable of burst-margined output, and the system is otherwise configured to carry out two back-to-back column access operations per row activation within a given memory component, the control component may program one or more mode registers (e.g., element 403 of FIG. 6) within the memory components to enable selectively margined data transfers over 8-bit burst intervals with single-margin-bit streams. Further, depending on the snooping and/or inferential capabilities of the attached memory components (i.e., not all operational capabilities described herein need be supported), the control component may program triggering modes (e.g., selection of how the memory component determines whether to output a margined burst or standard burst), and depending upon the availability of one or more surplus signaling links (or surplus bandwidth) within the memory system and the capabilities of the memory components, the control component may program one of multiple different margin streaming modes. Moreover, if the control component determines that the memory component population is non-uniform (i.e., hybrid in the sense that different memory components have different margining capabilities), the control component may program different margining modes within the different memory components and maintain a profile for each memory component (or each differently programmed group of memory components) that can be used to control data transmission and reception in accordance with the various margining formats. By contrast, if the control component determines that the memory component population has uniform margining capabilities, the control component may control data transmission and reception in accordance with a single margining profile maintained for the collective group of memory components.

It should be noted that the run-time configuration approach described in reference to FIG. 9 may alternatively be applied during system production or integration (e.g., with a human operator or automated production equipment executing the operations shown at 519-525). Further, the same general approach may be followed by a system designer. For example, the system designer may determine the characteristics of the intended memory population and the likelihood of link contention given the system topology, and then specify margin modes that are to be hardwired or programmed within the system components accordingly.

Figure 10:
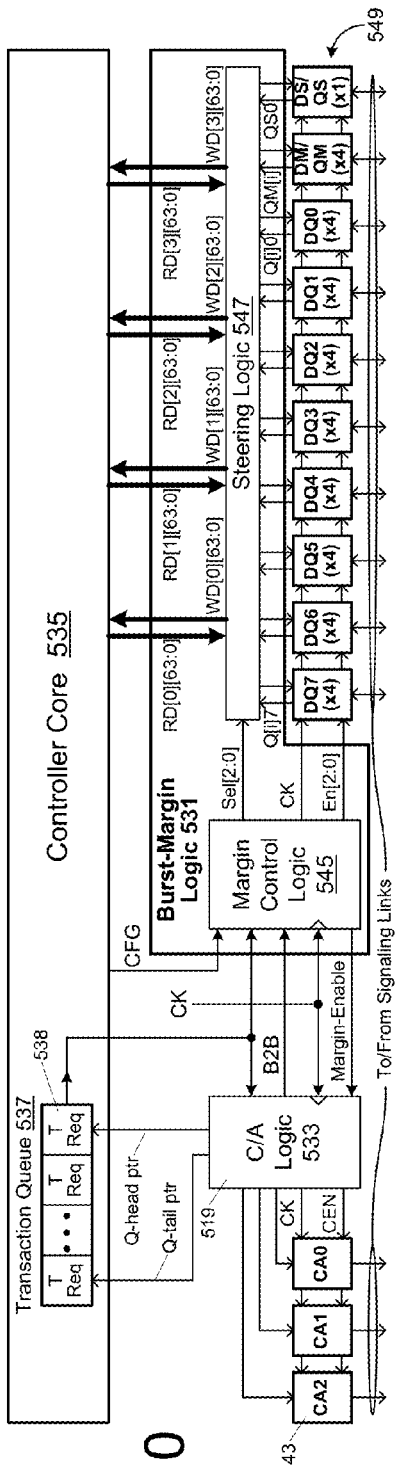
FIG. 10 illustrates an embodiment of a burst-margin interface logic circuit that may be provided within the control component to manage reception of margin-controlled read-data bursts from attached memory components.

FIG. 10 illustrates an embodiment of a burst-margining interface logic circuit 531 that may be provided within the control component to manage reception of margined read-data bursts from attached memory components. As shown, interface logic 531 includes a controller core 535, command/address (C/A) logic 533, burst-margin logic 531, command/address transmitters 143 (CA2, CA1, CA0, although more or fewer transmitters may be provided in alternative embodiments) and data signaling transceivers 549, the latter including data transceivers (DQ), data-mask transceivers (DM/QM) and a surplus transceiver (DS/QS). As with the memory component signaling interface of FIG. 5A, only a subset of the signaling circuitry is shown and more specifically, only the eight data transceivers, data-mask transceiver and optional surplus transceiver that form a byte-wide data interface. In an actual implementation, three additional sets of eight data transceivers and three additional data-mask transceivers may be provided to establish a 32-bit wide data interface (i.e., four parallel byte-wide data interfaces) and, further, one or more additional instances of the 32-bit wide data interface may be provided if practicable using a given interconnect technology (e.g., many such 32-bit wide interfaces may be implemented in a TSV-connected set of memory components).

Memory transaction requests, submitted by on-die control logic (e.g., where the control component is a CPU or otherwise self-generates memory transaction requests) or a separate host CPU, ASIC, etc., are buffered within the controller core 535 and more specifically in a transaction queue 538, under control of the C/A logic. More specifically, in the embodiment shown, C/A logic 533 (also referred to herein as a command decoder) loads incoming transaction requests into the transaction queue 537 at a location indicated by a queue-tail pointer (incrementing pointer "Q-tail ptr" to point to the next available transaction buffer within transaction queue 537) and pops each completed or commenced transaction request off the head of the transaction queue by incrementing a queue-head pointer ("Q-head ptr") to point to a new head-of-queue transaction request. For example, in the case of a transaction request that specifies a memory read operation, C/A logic 533 may issue a memory read command and corresponding address value (e.g., rank-select or chip-select, bank address and column address) to a given memory component by supplying successive sets of command/address bits to the command/address transmitters 143 and raising a command-enable (CEN) signal for a number of cycles or transitions of an I/O clock signal (CK) corresponding to the command burst length. After the command has been output, the command transmission may be logged within data buffering logic (e.g., within the controller core 535, though not specifically shown in FIG. 10) to enable correlation of the transmitted command with any incoming or outgoing data. For example, logging a memory write command may trigger a write data transmission via burst-margin logic 531 and transceivers 549 shortly after (or concurrently with) command transmission, and logging a memory read command may allocate a read-data buffer within the controller core 535 and schedule a buffer load operation in which read data, eventually received via transceivers 549 and margin logic 531, is loaded into the buffer.

After a given memory command is issued and the queue-head pointer advanced (thereby evicting or popping the prior head-of-queue transaction request from the head of transaction queue 537), the new head-of-queue transaction, if any, is evaluated by the C/A logic 533 to determine if data transmission from different components in back-to-back burst intervals may be required. If back-to-back, differently-sourced transmissions are to be effected, the C/A logic outputs a back-to-back signal ("BTB") to a margin control logic circuit 545 within burst-margin logic 531 to signal the need for a burst-margined data output, if supported by the data-transmission source. If margin control logic 545 determines that a burst-margined transfer may be supported under the current system configuration (e.g., as indicated by configuration information, "CFG"), the margin control logic outputs a margin-enable signal ("Margin-Enable") to C/A logic 533. In the embodiment shown, the margin-enable signal serves the dual purpose of controlling the type of margining specified within an outgoing memory access command (e.g., whether to specify margining in the command and optionally specifying the margin-bit streaming mode), if any, and to inform the C/A logic that burst-margined transmission is available to avoid contention. Accordingly, the C/A logic may construct the outgoing command with individual control bits set or cleared as necessary to specify margining options, or, if the margin-enable signal is not asserted by margin control logic 545, take other action to avoid signaling contention, including inserting a time delay (i.e., bubble) between issuance of memory commands that would otherwise result in back-to-back burst intervals.

In the embodiment of FIG. 10, margin control logic 545 operates synchronously with respect to the I/O clock signal (CK), and responds to the memory access operation signaled by the head-of-queue transaction request by asserting select signals (Sel) and enable signals (En) in the appropriate state (and after an appropriate delay that accounts, for example, for read-data retrieval and transmission time within a commanded memory component) to effect reception/transmission of margined and non-margined data bursts. With regard to incoming read-data, for example, steering logic 547 and transceivers 549 respond to the select and enable signals from the margin control logic to perform data reception and steering operations that are essentially the reverse of the operations described in reference to FIGS. 5A-5C and 7A-7E. That is, in the case of burst-margined data reception, margin-bits received serially via the DM/QM transceiver and/or surplus (DS/QS) transceiver are parallelized and combined with data received via the DQ transceivers to complete a set of memory sub-words (RD[0][63:0]-RD[3][63:0]) and thereby deliver a 256-bit memory word to controller core 535 (e.g., for storage in a data buffer therein and for eventual transfer to requesting logic or a requesting device). As explained in further detail below, the control component may also output write data in burst-margined formats to avoid signaling contention, and thus the margin control logic 545 may issue select signals and enable signals to the steering logic 547 and transceivers 549 to effect burst-margined output generally as described in reference FIGS. 5A-5C and 7A-7E.

Figure 11:
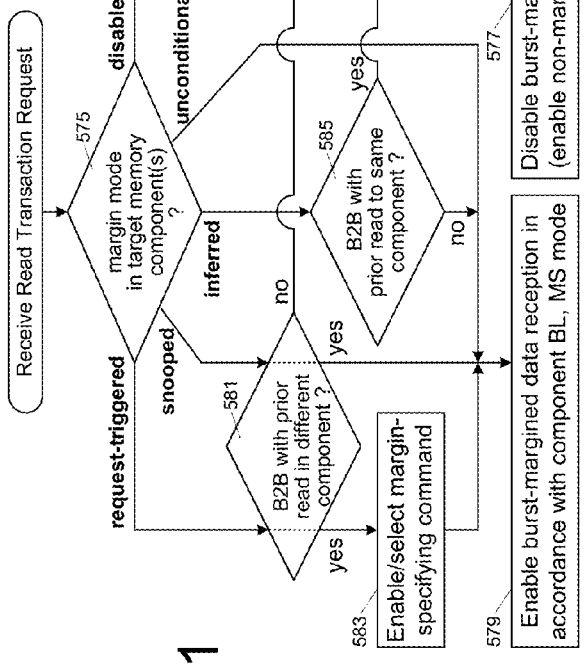
FIG. 11 illustrates a conceptual view of the operations carried out by margin control logic of FIG. 10 in connection with memory read transaction requests.

FIG. 11 illustrates a conceptual view of the operations carried out by margin control logic 545 of FIG. 10 in connection with memory read transaction requests. At 575, the margin mode (e.g., burst margin mode and/or margin trigger mode) of the target memory component (i.e., the memory component commanded to output read data) are evaluated. If margining is disabled within the target memory component, then the margin control logic issues select and enable signals as necessary to receive read data in a standard burst format as shown at 577 (i.e., disabling burst-margined data reception and instead enabling non-margined data reception during the burst interval). Conversely, if the margin mode indicates unconditional margining, then the margin control logic issues select and enable signals as necessary to receive a burst-margined output (i.e., abbreviated burst format) in accordance with the burst-length (BL) and margin-streaming (MS) mode of the target memory component as shown at 579. If the margin mode indicates request-triggered margining, then the margin control logic determines whether the read-data reception is to occur back-to-back with a memory read from a different memory component at 581 (e.g., by evaluating the BTB signal from the C/A logic) and, if so, enables transmission of a margin-specifying memory read command at 583 (e.g., by raising the margin-enable signal), and also enables corresponding burst-margined data reception at 579. If read-data reception is not to occur back-to-back with reception of read data from a different memory component (i.e., the determination at 581 is negative), non-margined output is enabled at 577. If the memory component margin mode is snoop triggered, then the margin control logic determines whether the read-data reception is to occur back-to-back with a memory read from a different memory component at 581 and, if so, enables transmission of a margin-specifying memory read command at 579. In this case, the margin-enable signal need not be raised, as the target memory component will snoop the command stream and chip-select lines (which may be or be viewed as part of the address information supplied in a memory command) to determine whether the potential contention exists (i.e., back-to-back read from different memory component) and, if so, will generate a burst-margined output. If snoop-triggered margin mode is specified within the target memory component, but no read-data reception is to occur back-to-back with a memory read from a different memory component, non-margined data output may be enabled. Lastly, if the memory component margin mode is inferentially triggered, the margin control logic determines at 585 whether the read-data reception is to occur back-to-back with (or at least within a predetermined time of) reception of a prior read-data burst from the same memory component. If so, then non-margined data reception is enabled at 577. Otherwise, if the read-data reception is not to occur within a predetermined time following reception of a read-data burst from the target memory component, then burst-margined data reception is enabled at 579 in accordance with the burst-length and margin-bit streaming modes of the target memory component. In this latter case (burst-margined data reception enabled), the margin-enable signal need not be raised, as the target memory component will infer that burst-margined output is needed in response to a time lapse without data output and will thus generate a burst-margined output.

As mentioned above, burst-margined data transfer is not limited to read-data transmission, but rather may also be applied by the control component when transmitting write data. That is, write-data output from the control component that occurs in a burst interval that immediately succeeds or precedes a read-data burst interval has the potential for the same link contention with respect to the read-data burst. Accordingly, in one embodiment, shown generally in FIGS. 12A and 12B, burst-margin logic circuits 635, 605 within control component 630 and memory components 601 include circuitry to enable burst-margined write-data signaling in addition to the above-described circuitry for effecting burst-margined read-data signaling. By this arrangement, burst-margined output may be selected within any component that transmits data on the data links, establishing a contention-avoiding margin at the leading or trailing bit interval of a write data burst and/or read-data burst.

Referring to the timing diagrams shown at 611 and 641 in FIGS. 12A and 12B, respectively, leading-edge write-data burst-margining may be effected by disabling the output drivers within the control-side signaling interface during a margin interval at the leading edge of a given burst interval, and thereafter serially transmitting the margin bits (i.e., the write data bits that control component 630 refrained from transmitting during the driver-disable or "margin" interval) via the DM/QM link and/or a surplus link (e.g., generally as described in reference to FIGS. 5A-5C and 7A-7E with respect to read data). In the read-write example of FIG. 12A, the leading-edge margin interval within write-data burst 615 avoids contention with a preceding read data burst 613 (without requiring bubble insertion), and in the write-read example of FIG. 12B, the leading-edge margin interval within a read-data burst 645 avoids contention with a preceding write data burst 643. In an alternative embodiment, trailing edge burst-margining may be used, with a trailing edge margin interval being implemented within read burst 613 of FIG. 12A to avoid contention with succeeding write data burst 615, and with a trailing-edge margin interval being implemented with write-data burst 643 of FIG. 12B to avoid contention with succeeding read-data burst 645.

Figure 13:
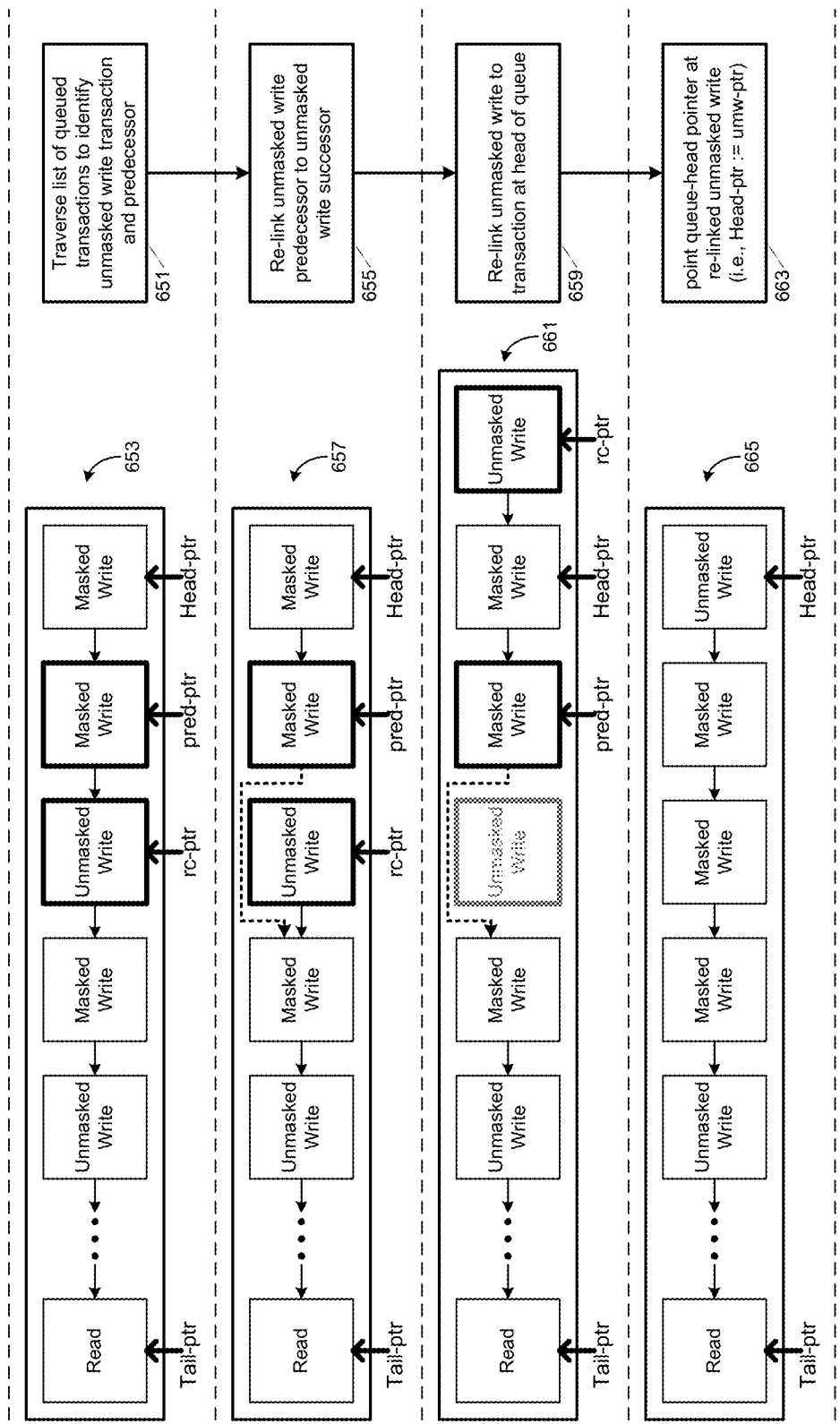
FIG. 13 illustrates an exemplary reordering operation within a transaction queue in which an unmasked write transaction is identified and re-positioned within the queue ahead of a masked write transaction, potentially freeing a data-mask link for margin-control use during a write data transmission.

One complication with burst-margined write data transmissions is that, in contrast to read-data transfers in which the data-mask link is unused, the data-mask link may be needed to convey write masking information with regard to a given write-data burst, thus presenting a potential conflict with regard to margin bit signaling. In one embodiment, this potential for conflict is resolved by reordering write transactions within the transaction queue (e.g., element 537 of FIG. 10) so that one or more unmasked write transactions are executed following (and/or preceding) memory read transactions (i.e., instead of masked write transactions), thus freeing the DM/QM link for margin bit transfer during a margined unmasked write data burst. FIG. 13 presents a conceptual view of such a transaction reordering operation. As shown at 651, the transaction queue (e.g., formed by a linked list of transaction requests in this example) is traversed starting from the head-of queue transaction to identify an unmasked write transaction and its predecessor transaction. In the exemplary transaction queue state shown at 653, for instance, a pair of temporary pointers, one to point to a relocation candidate ("rc-ptr") and one to point to the predecessor of the relocation candidate ("pred-ptr") have been stepped through the list of queued transactions, until the relocation candidate (i.e., the memory transaction pointed to by the rc-ptr) is determined to be an unmasked write.

Having identified a relocatable transaction (i.e., identified a relocatable unmasked write transaction within the transaction queue), queue management logic (e.g., logic within the command/address logic of the control component) re-links the predecessor transaction (a "Masked Write" transaction in this example) to the relocatable transaction to its successor at 655 (e.g., as shown by the dashed pointer in transaction queue state 657). By this operation, the relocatable candidate is removed from the linked list of transactions and made available for re-insertion at the head of the queue. Accordingly at, 659, the queue management logic re-links the relocatable transaction (i.e., the identified unmasked write operation) at the head of the queue (thus yielding the transaction queue state 661) and then concludes the relocation operation at 663 by assigning the queue-head pointer to value of the relocation candidate pointer, and thus pointing the queue-head pointer at the now-relocated unmasked write operation. The resulting re-ordered state of the transaction queue is shown at 665.

The exemplary transaction reordering operation shown in FIG. 13 may be repeated as necessary to establish any number of back-to-back unmasked write operations at the head of the queue and thus free the QM/DM link for conveyance of margining bits over the number of burst intervals required for a given burst length and margin-bit streaming mode. Also, various optimizations may be carried out, such as identifying and relocating sequences of back-to-back unmasked write transactions in a single traversal of the transaction queue (and/or upon initial insertion into the transaction queue) instead of relocating one unmasked write transaction per queue traversal. Also, to the extent that a given relocation candidate is an unmasked write directed to the same address as a preceding masked or unmasked write, the preceding masked or unmasked write may be deleted from the queue as part of or in association with the re-ordering operation, thereby preventing out-of-order writes of different data to the same memory location. More generally, virtually any technique for ordering and/or re-ordering the sequence of memory transactions within the control component to advance unmasked writes to the head of a sequence of write operations (or tail of a sequence of write operations, if trailing-edge burst-margining is used) directed by the control component may be applied to enable burst-margined write-data transmission in alternative embodiments.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" may include, for example and without limitation, loading a control value into a register or other storage circuit within the device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. As used herein, the term "margining" refers to establishing a time interval at the leading or trailing edge of a bit transmission interval or burst interval to avoid inadvertent contention with another signaling source, and not to signal-integrity timing and/or voltage margin testing (i.e., data-eye width/height measurement). The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within a component of a memory system, the method comprising:
   receiving, as part of a first memory access operation, first data that consists of N data words conveyed via a first number of signaling links in N respective transmit intervals; and
   receiving, as part of a second memory access operation, second data that consists of (i) N−1 data words conveyed via the first number of signaling links in N−1 respective transmit intervals, and (ii) a data word conveyed via one or more additional signaling links that are distinct from the first number of signaling links.

2. The method of claim 1 wherein the component of the memory system comprises a memory controller and wherein receiving first data and receiving second data comprises receiving first read data and receiving second read data within the memory controller.

3. The method of claim 2 wherein receiving first read data comprises receiving the first read data from a first memory device of the memory system, and wherein each transmit interval of the N respective transmit intervals and each transmit interval of the N−1 respective transmit intervals has a duration substantially equal to a column cycle time of the first memory device divided by N.

4. The method of claim 3 wherein receiving second read data comprises receiving the second read data from a second memory device of the memory system, each of the first and second memory devices being coupled to the first number of signaling links and to the one or more additional signaling links.

5. The method of claim 3 wherein the one or more additional signaling links comprise fewer signaling links than the first number of signaling links.

6. The method of claim 2 wherein receiving second read data comprises receiving a plurality of the bits of the data word conveyed via the one or more additional signaling links serially via a first signaling link of the one or more additional signaling links, the method further comprising transmitting write data to a first memory device via the first number of signaling links and transmitting mask information via the first signaling link of the one or more additional signaling links, the write data including a plurality of data words and the mask information including a plurality of mask bits, each of the mask bits indicating whether a respective data word of the write data is to be stored within the first memory device.

7. The method of claim 2 further comprising outputting, at respective first and second times, a first read command requesting transmission of the first read data and a second read command requesting transmission of the second read data, wherein each transmit interval of the N respective transmit intervals and each transmit interval of the N−1 respective transmit intervals has a substantially uniform transmit-interval duration and wherein a difference between the first and second times is substantially equal to N times the duration.

8. The method of claim 7 wherein outputting the first and second read commands at the respective first and second times defines respective first and second burst intervals on the first number of signaling links, each burst interval having a burst-interval duration of N times the transmit-interval duration, and wherein the first burst interval spans the N respective transmit intervals, and wherein the second burst interval spans the N−1 respective transmit intervals and an unused transmit interval.

9. The method of claim 8 wherein the second read command specifies that the second read data is to be transmitted in part via the one or more additional signaling links to establish the unused transmit interval.

10. The method of claim 1 wherein the component of the memory system is a first memory integrated-circuit (IC) having a predetermined column cycle time, and wherein receiving the first data comprises receiving first write data within the first memory IC, and wherein each transmit interval of the N respective transmit intervals and each transmit interval of the N−1 respective transmit intervals has a duration substantially equal to a column cycle time of the first memory IC divided by N.

11. The method of claim 1 wherein the component of the memory system is a memory integrated-circuit (IC) and wherein receiving the first data and receiving the second data comprises receiving first write data and receiving second write data.

12. The method of claim 11 further comprising receiving mask information via the one or more additional signaling links during at least a portion of the N respective transmit intervals in which the first write data is received, the mask information including a plurality of mask bits, each of the mask bits indicating whether a respective data word of the write data is to be stored within the memory IC.

13. The method of claim 11 further comprising receiving, at respective first and second times, a first write command requesting storage of the first write data and a second write command requesting storage of the second write data, wherein each transmit interval of the N respective transmit intervals and each transmit interval of the N−1 respective transmit intervals has a substantially uniform transmit-interval duration and wherein a difference between the first and second times is substantially equal to N times the duration.

14. The method of claim 13 wherein receiving the first and second write commands at the respective first and second times defines respective first and second burst intervals on the first number of signaling links, each burst interval having a burst-interval duration of N times the transmit-interval duration, and wherein the first burst interval spans the N respective transmit intervals, and wherein the second burst interval spans the N−1 respective transmit intervals and an unused transmit interval.

15. A memory system component comprising:
a first number of signal receivers to receive (i) N data words conveyed via a first number of signaling links in N respective transmit intervals in association with a first memory access command, and (ii) N−1 data words conveyed via the first number of signaling links in N−1 respective transmit intervals in association with a second memory access command; and
one or more additional signal receivers to receive a data word conveyed via one or more additional signaling links in association with the second memory access command.

16. The memory system component of claim 15 wherein each of the N data words conveyed in association with the first memory access command consists of the first number of bits, each of the N−1 data words conveyed via the first number of signaling links in association with the second memory access command consists of the first number of bits, and the data word conveyed via the one or more additional signaling links in association with the second memory access command consists of the first number of bits.

17. The memory system component of claim 15 wherein the one or more additional signal receivers to receive the data word conveyed via the one or more additional signaling links comprises circuitry to receive bits of the data word serially via a first signaling link of the one or more additional signaling links.

18. The memory system component of claim 17 wherein the first number of signal receivers to receive the N−1 data words conveyed via the first number of signaling links in association with the second memory access command comprises circuitry to receive constituent bits of each of the N−1 data words in parallel via the first number of signaling links.

19. The memory system component of claim 17 further comprising a plurality of data output drivers to transmit write data to a first memory device via the first number of signaling links and a data-mask output driver to transmit mask information via the first signaling link of the one or more additional signaling links, the write data including a plurality of write data words and the mask information including a plurality of mask bits, each of the mask bits indicating whether a respective one of the write data is to be stored within the first memory device.

20. The memory system component of claim 15 wherein the first number of signal receivers to receive the N data words conveyed in association with the first memory access command comprise circuitry to receive the N data words conveyed in association with the first memory access command from a first memory device in response to a timing signal that defines the N transmit intervals, and wherein each transmit interval of the N respective transmit intervals and each transmit interval of the N−1 respective transmit intervals has a duration substantially equal to a column cycle time of the first memory device divided by N.

21. The memory system component of claim 20 wherein first number of signal receivers and the one or more additional receivers to receive the N data words conveyed in association with the second memory access command comprise circuitry to receive the N data words conveyed in association with the second memory access command from a second memory device, each of the first and second memory devices being coupled to the first number of signaling links and to the one or more additional signaling links.

22. The memory system component of claim 15 further comprising command/address circuitry to output, at respective first and second times, the first memory access command and the second memory access command, wherein each transmit interval of the N respective transmit intervals and each transmit interval of the N−1 respective transmit intervals has a substantially uniform transmit-interval duration and wherein a difference between the first and second times is substantially equal to N times the duration.

23. The memory system component of claim 22 wherein the command/address circuitry to output the first and second read commands at the respective first and second times comprises synchronous circuitry to define respective first and second burst intervals on the first number of signaling links, each burst interval having a burst-interval duration of N times the transmit-interval duration, and wherein the first burst interval spans the N respective transmit intervals, and wherein the second burst interval spans the N−1 respective transmit intervals and an unused transmit interval.

24. The memory system component of claim 23 wherein the second memory access command specifies that at least one data word of the N data words to be conveyed to the memory controller in association with the second memory access command is to be transmitted via the one or more additional signaling links to establish the unused transmit interval.

25. The memory system component of claim 15 further comprising a core storage array in which at least a portion of the data words conveyed in association with the first and second memory access commands are to be stored.

26. The memory system component of claim 25 wherein the first number of signal receivers to receive the N data words conveyed in association with the first memory access command comprise circuitry to receive the N data words conveyed in association with the first memory access command from a memory controller in response to a timing signal that defines the N transmit intervals, and wherein each transmit interval of the N respective transmit intervals and each transmit interval of the N−1 respective transmit intervals has a duration substantially equal to a predetermined column cycle time of the core storage array divided by N.

27. The memory system component of claim 26 wherein the first and second memory access commands are first and second memory write commands, and wherein the one or more additional signal receivers are further to receive a mask information in association with the first memory write command, the mask information including a plurality of mask bits, each of the mask bits indicating whether a respective one of the N data words conveyed in association with the first memory write command is to be stored within the core storage array.

28. A memory system component comprising:
- means for receiving, as part of a first memory access operation, first data that consists of N data words conveyed via a first number of signaling links in N respective transmit intervals; and
- means for receiving, as part of a second memory access operation, second data that consists of (i) N−1 data words conveyed via the first number of signaling links in N−1 respective transmit intervals, and (ii) a data word conveyed via one or more additional signaling links that are distinct from the first number of signaling links.

* * * * *